(12) United States Patent
Tashiro et al.

(10) Patent No.: US 9,887,168 B2
(45) Date of Patent: Feb. 6, 2018

(54) THERMAL FLOW METER

(71) Applicant: Hitachi Automotive Systems, Ltd., Hitachinaka-shi, Ibaraki (JP)

(72) Inventors: Shinobu Tashiro, Hitachinaka (JP); Keiji Hanzawa, Hitachinaka (JP); Noboru Tokuyasu, Hitachinaka (JP); Takeshi Morino, Hitachinaka (JP); Ryosuke Doi, Hitachinaka (JP); Akira Uenodan, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 15/621,053

(22) Filed: Jun. 13, 2017

(65) Prior Publication Data

US 2017/0345776 A1 Nov. 30, 2017

Related U.S. Application Data

(63) Continuation of application No. 14/407,123, filed as application No. PCT/JP2013/065132 on May 31, 2013, now Pat. No. 9,721,908.

(30) Foreign Application Priority Data

Jun. 15, 2012 (JP) ................................ 2012-136347

(51) Int. Cl.
*H01L 23/00* (2006.01)
*G01F 1/684* (2006.01)
(Continued)

(52) U.S. Cl.
CPC .......... *H01L 23/564* (2013.01); *F02D 41/187* (2013.01); *G01F 1/684* (2013.01); (Continued)

(58) Field of Classification Search
CPC . H01L 2224/45144; H01L 2224/48091; H01L 2924/00; H01L 2924/00014; (Continued)

(56) References Cited

U.S. PATENT DOCUMENTS 6,020,625 A * 2/2000 Qin .................... H01L 23/49503
257/666
6,516,785 B1 2/2003 Nakada et al.
(Continued)

FOREIGN PATENT DOCUMENTS

CN        1437697 A      8/2003
JP    2010-192511 A      9/2010
(Continued)

OTHER PUBLICATIONS

International Search Report (PCT/ISA/210) dated Jul. 9, 2013, with English translation (Three (3) pages).

*Primary Examiner* — Francis Gray
(74) *Attorney, Agent, or Firm* — Crowell & Moring LLP

(57) ABSTRACT

Provided is a thermal flow meter that can be prevented from being eroded due to adhesion of water or like to a cut end portion of the lead exposed from the mold resin of the circuit package. A thermal flow meter 300 of the present invention is a thermal flow meter having a circuit package 400 formed by mounting a detection element 518 on leads 544 and 545 supported by a support frame 512, sealing with a mold resin, and cutting off the support frame 512, wherein cut end portions 544a and 545a of the leads 544 and 545 exposed from the mold resin of the circuit package 400 by cutting off the support frame 512 is covered by a covering portion 371.

7 Claims, 19 Drawing Sheets

(51) Int. Cl.

| | | |
|---|---|---|
| F02D 41/18 | (2006.01) | |
| H01L 23/10 | (2006.01) | |
| G01M 15/10 | (2006.01) | |
| G01F 15/18 | (2006.01) | |
| G01F 15/14 | (2006.01) | |
| G01F 15/04 | (2006.01) | |
| G01F 15/02 | (2006.01) | |
| G01F 15/00 | (2006.01) | |
| G01F 5/00 | (2006.01) | |
| G01F 1/696 | (2006.01) | |
| G01F 1/699 | (2006.01) | |
| G01F 1/698 | (2006.01) | |

(52) U.S. Cl.
CPC .......... *G01F 1/6842* (2013.01); *G01F 1/6845* (2013.01); *G01F 1/696* (2013.01); *G01F 1/698* (2013.01); *G01F 1/699* (2013.01); *G01F 1/6965* (2013.01); *G01F 5/00* (2013.01); *G01F 15/006* (2013.01); *G01F 15/02* (2013.01); *G01F 15/04* (2013.01); *G01F 15/043* (2013.01); *G01F 15/14* (2013.01); *G01F 15/185* (2013.01); *G01M 15/10* (2013.01); *H01L 23/10* (2013.01); *H01L 2224/45144* (2013.01); *H01L 2224/48091* (2013.01); *H01L 2224/48137* (2013.01); *H01L 2224/73265* (2013.01); *H01L 2924/00* (2013.01); *H01L 2924/00014* (2013.01)

(58) Field of Classification Search
CPC . H01L 2224/48137; H01L 2224/73265; H01L 23/10; H01L 23/564; G01F 15/02; G01F 15/04; G01F 15/043; G01F 15/14; G01F 15/185; G01F 1/684; G01F 1/6842; G01F 1/6845; G01F 1/696; G01F 1/6965; G01F 1/698; G01F 1/699; G01F 5/00; F02D 41/187; G01M 15/10
See application file for complete search history.

(56) References Cited

U.S. PATENT DOCUMENTS

| | | | |
|---|---|---|---|
| 2006/0112763 A1* | 6/2006 | Uramachi | G01F 1/6842 73/204.22 |
| 2007/0022808 A1 | 2/2007 | Tanaka et al. | |
| 2009/0049921 A1 | 2/2009 | Otsuka et al. | |
| 2015/0185058 A1* | 7/2015 | Morino | G01F 1/6842 73/204.11 |

FOREIGN PATENT DOCUMENTS

| | | |
|---|---|---|
| JP | 2010-197102 A | 9/2010 |
| JP | 2011-252796 A | 12/2011 |

\* cited by examiner

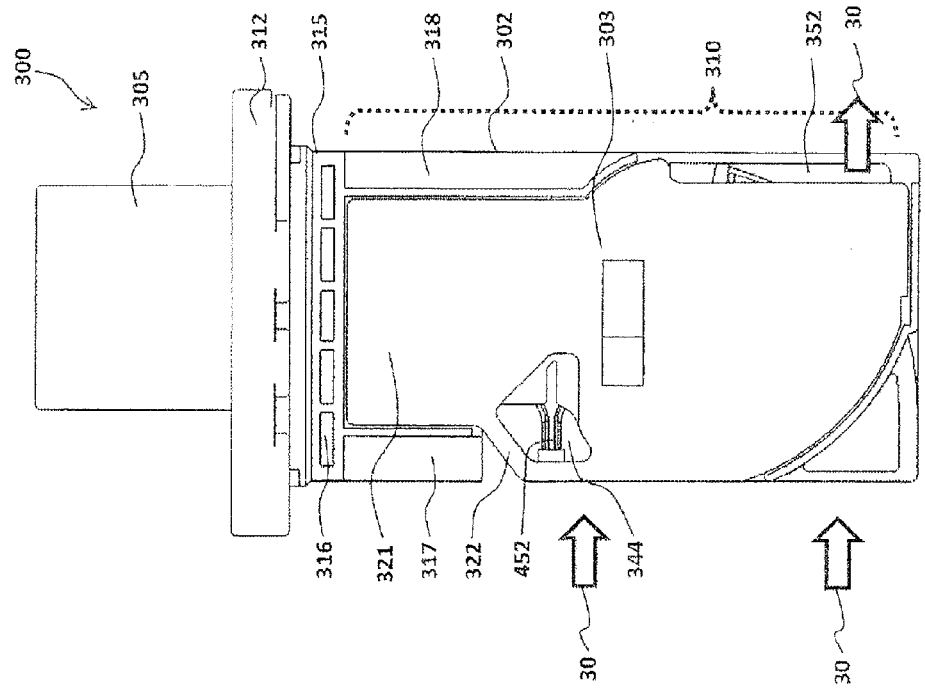
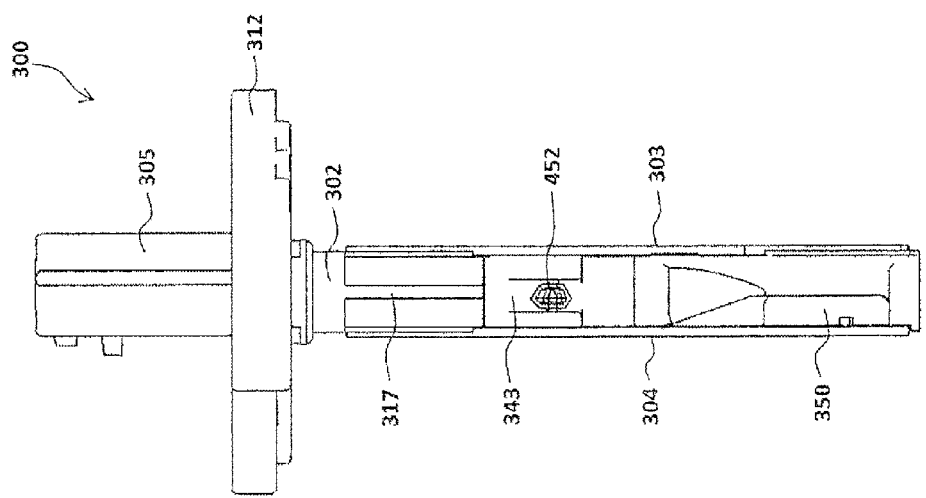

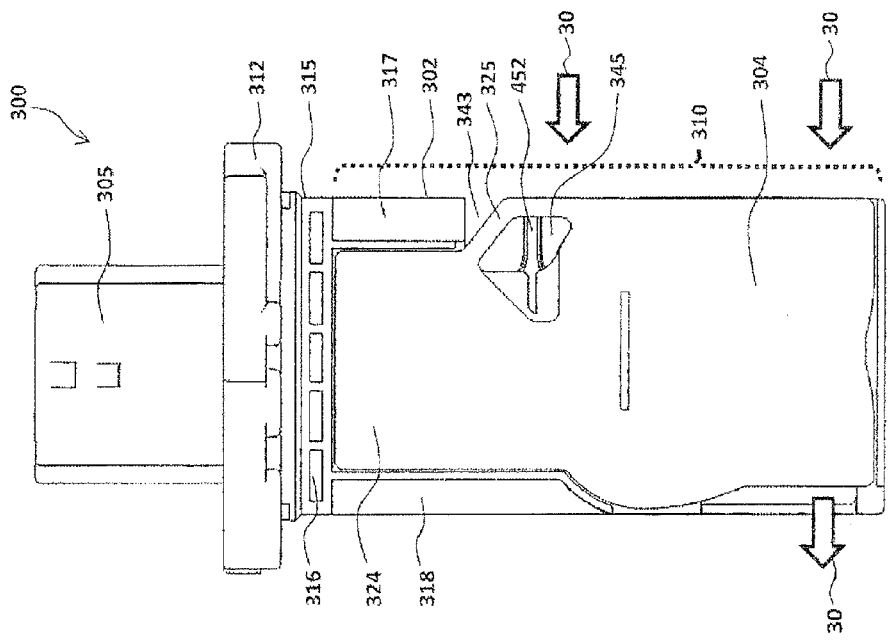
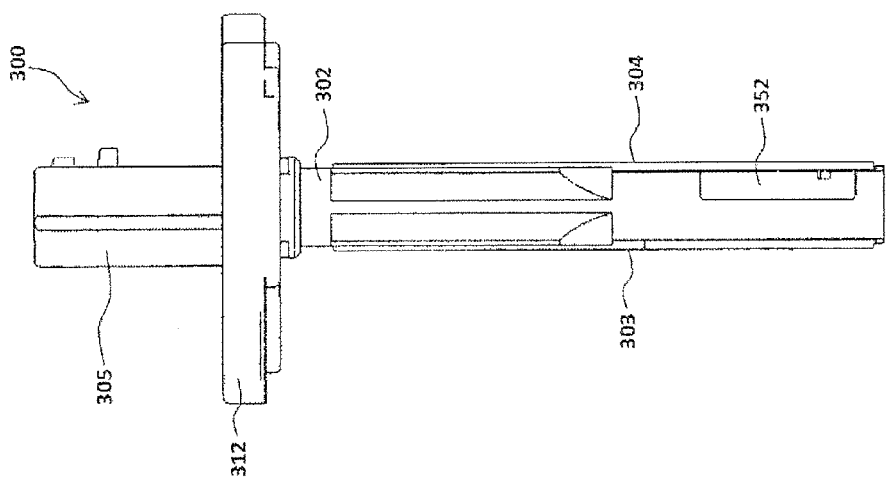
FIG. 3A
FIG. 3B

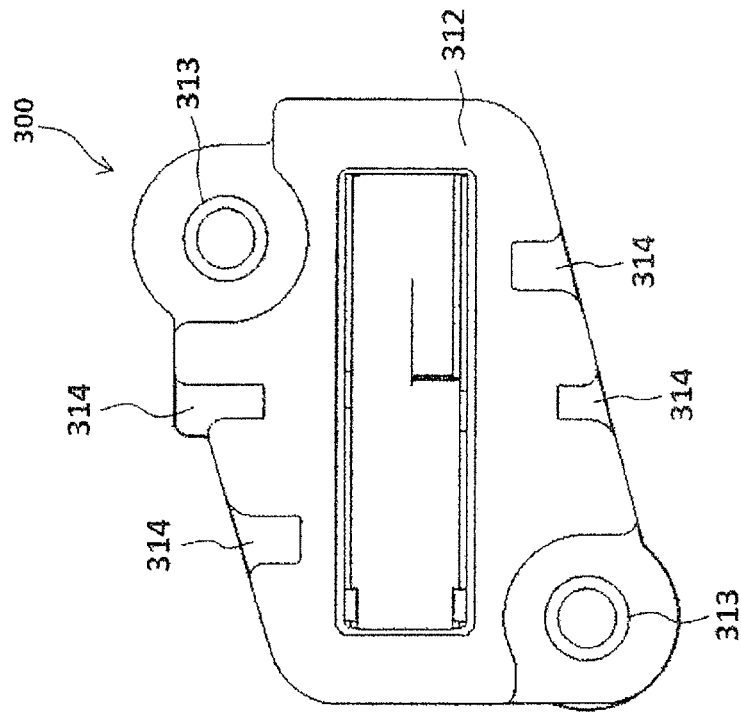
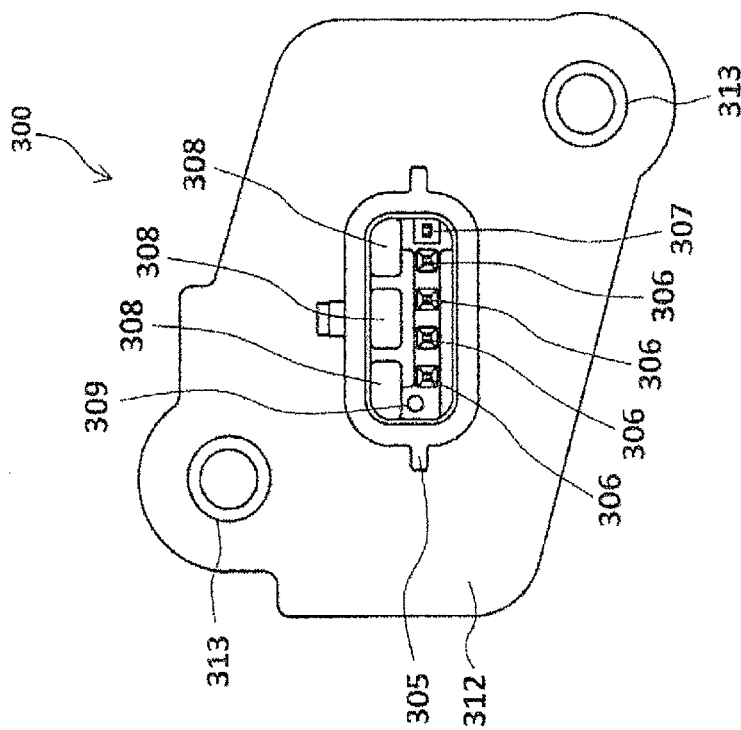

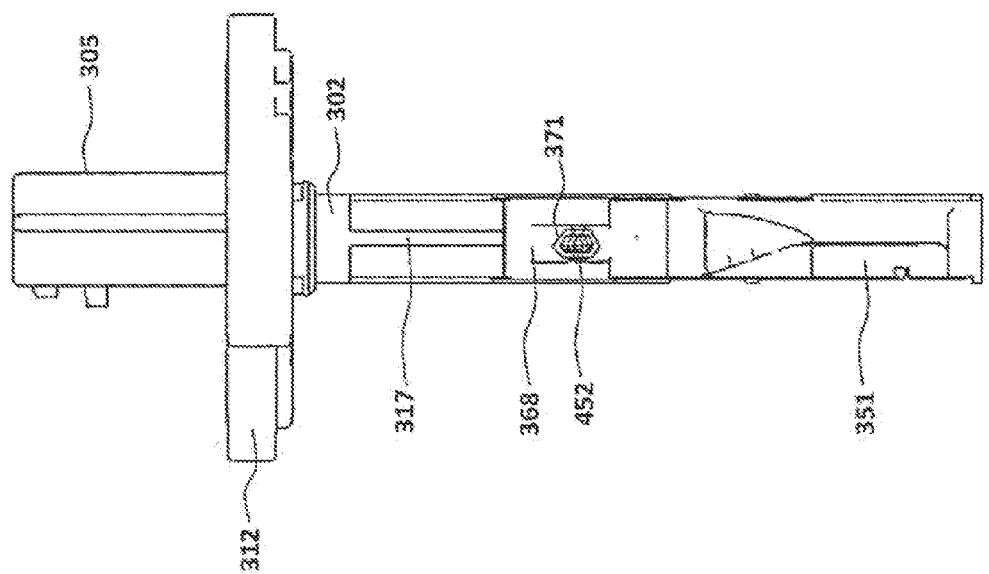
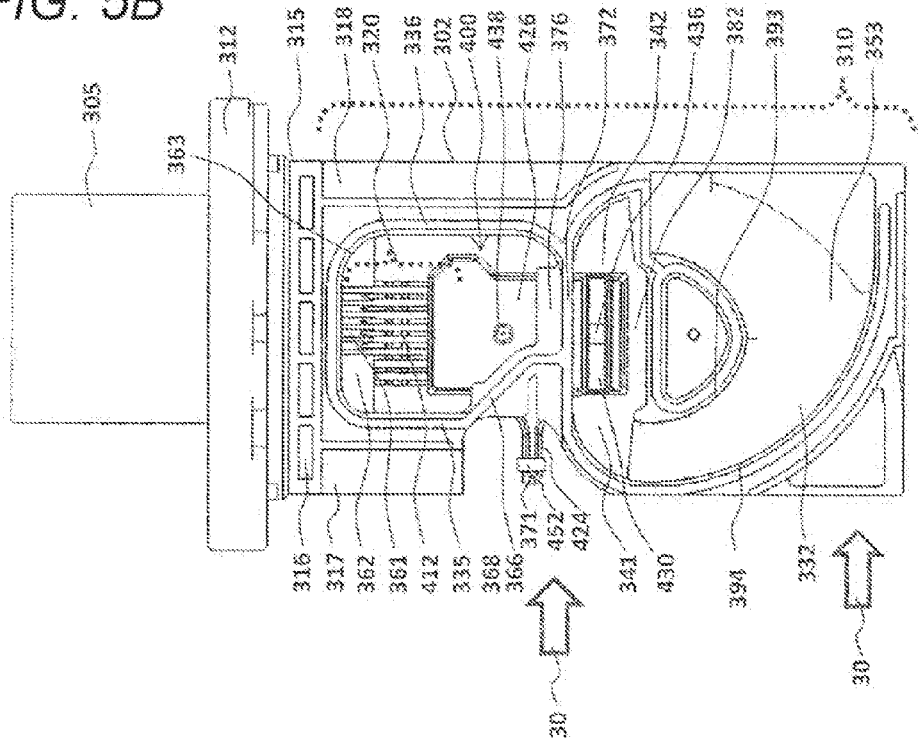

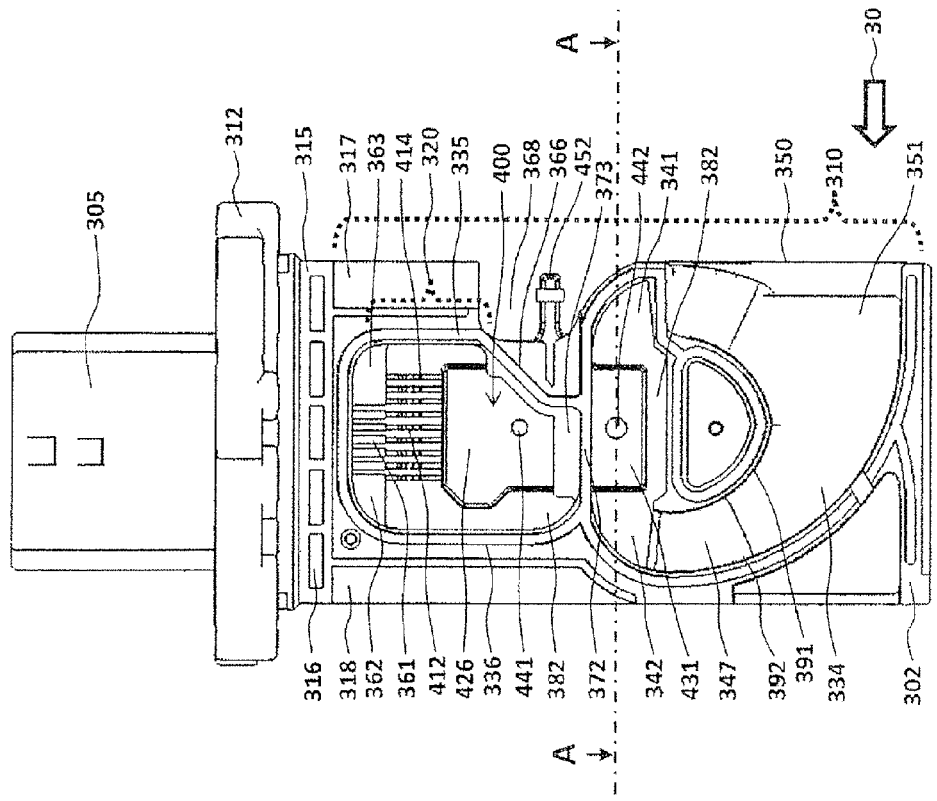
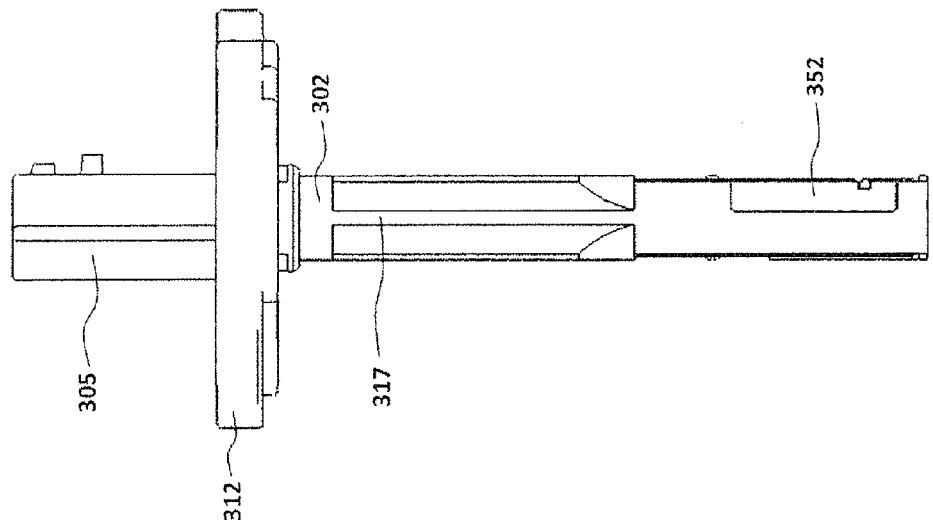
FIG. 6A
FIG. 6B

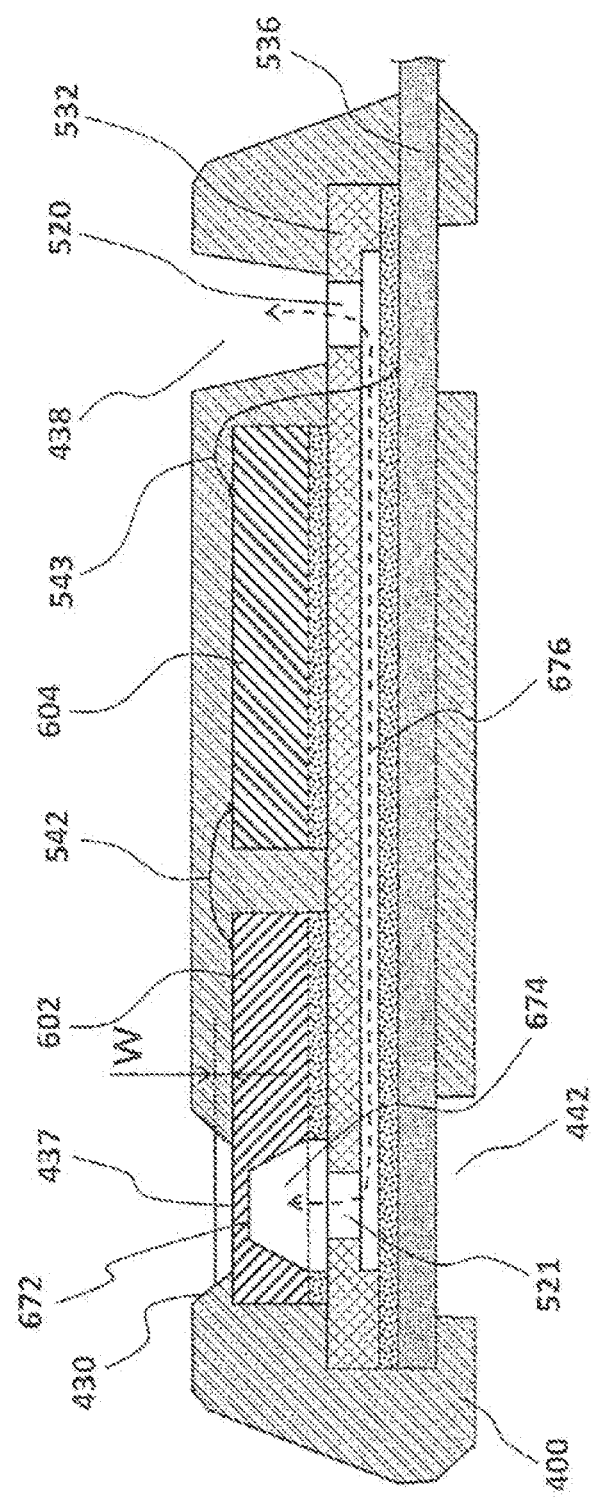

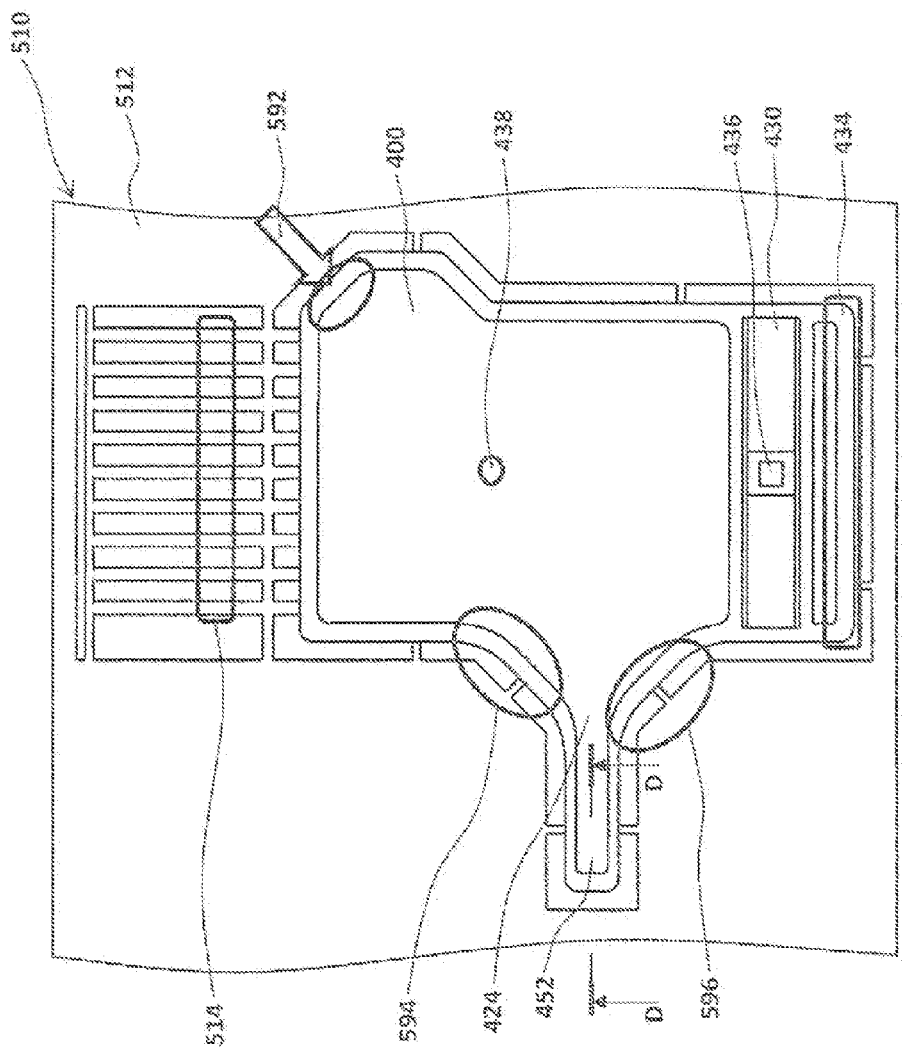

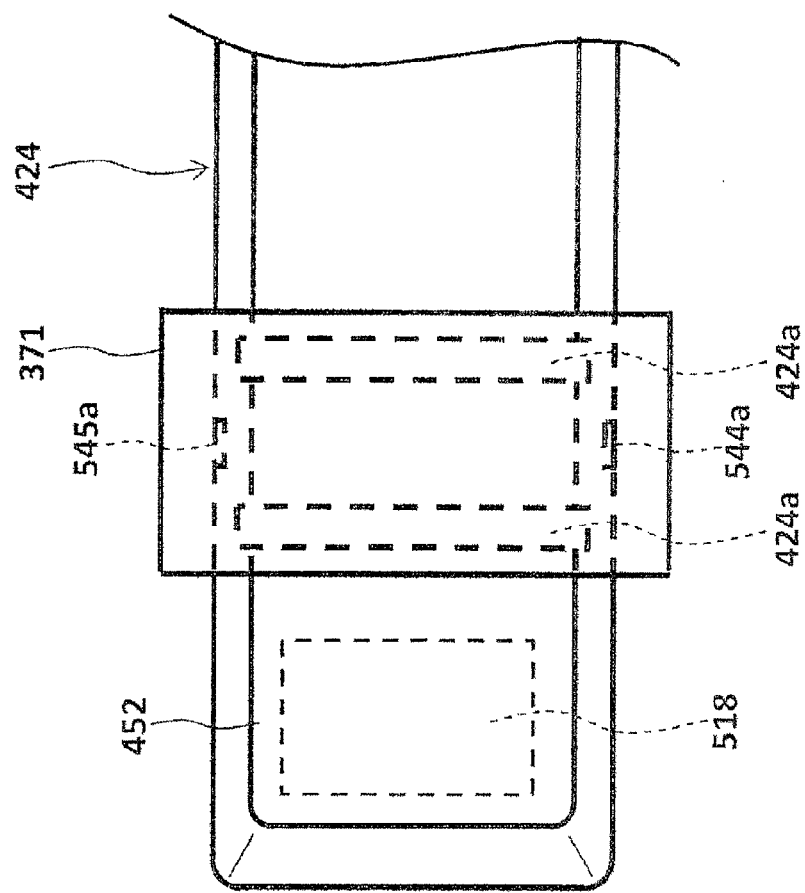
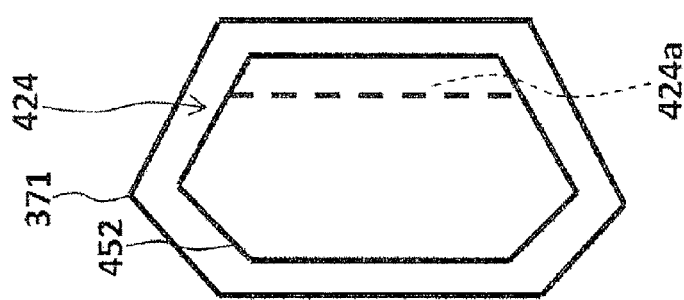

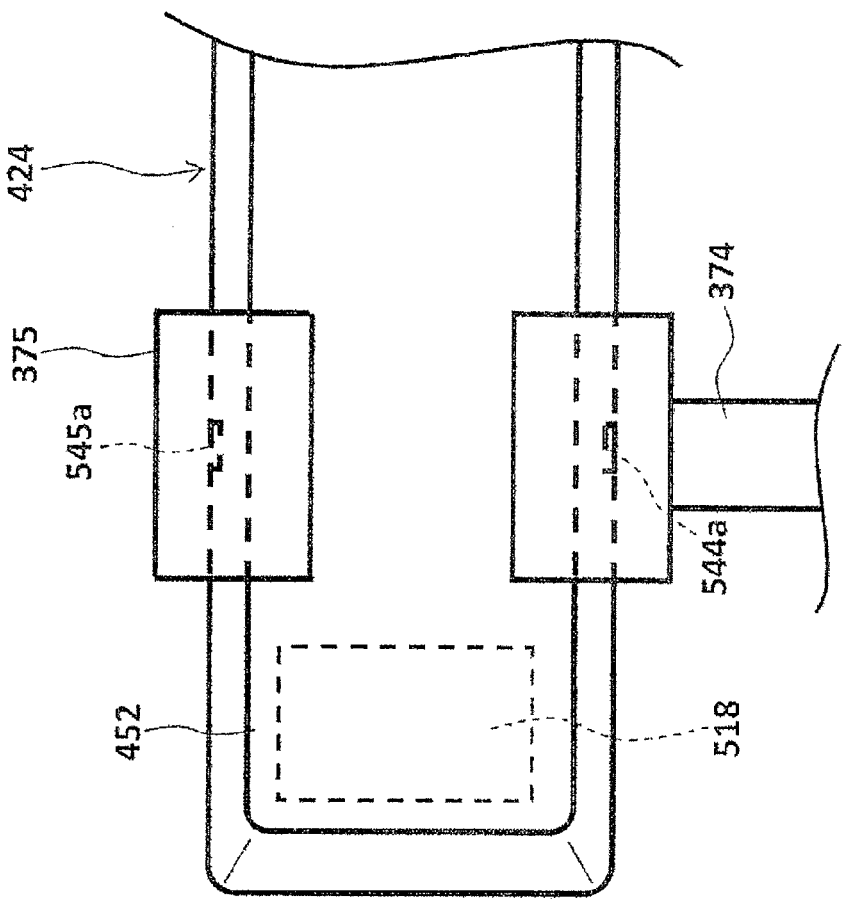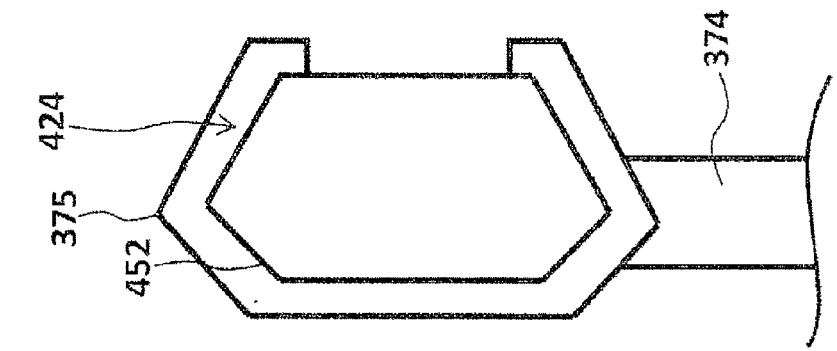

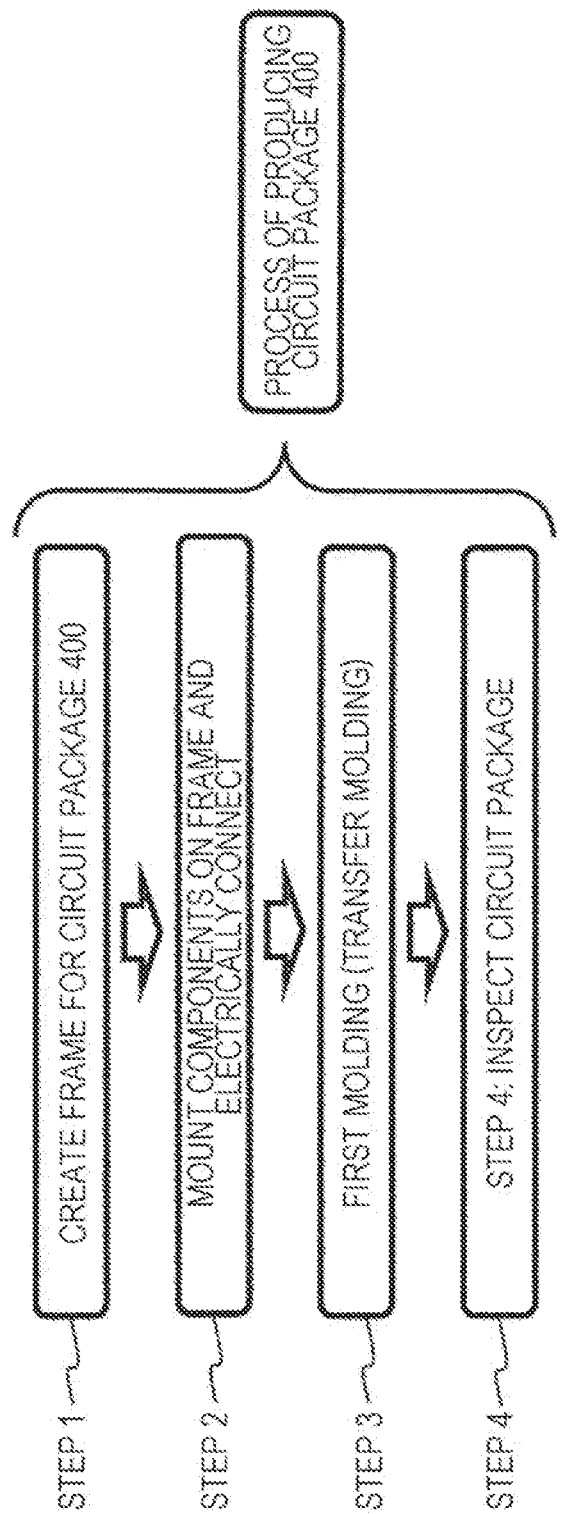

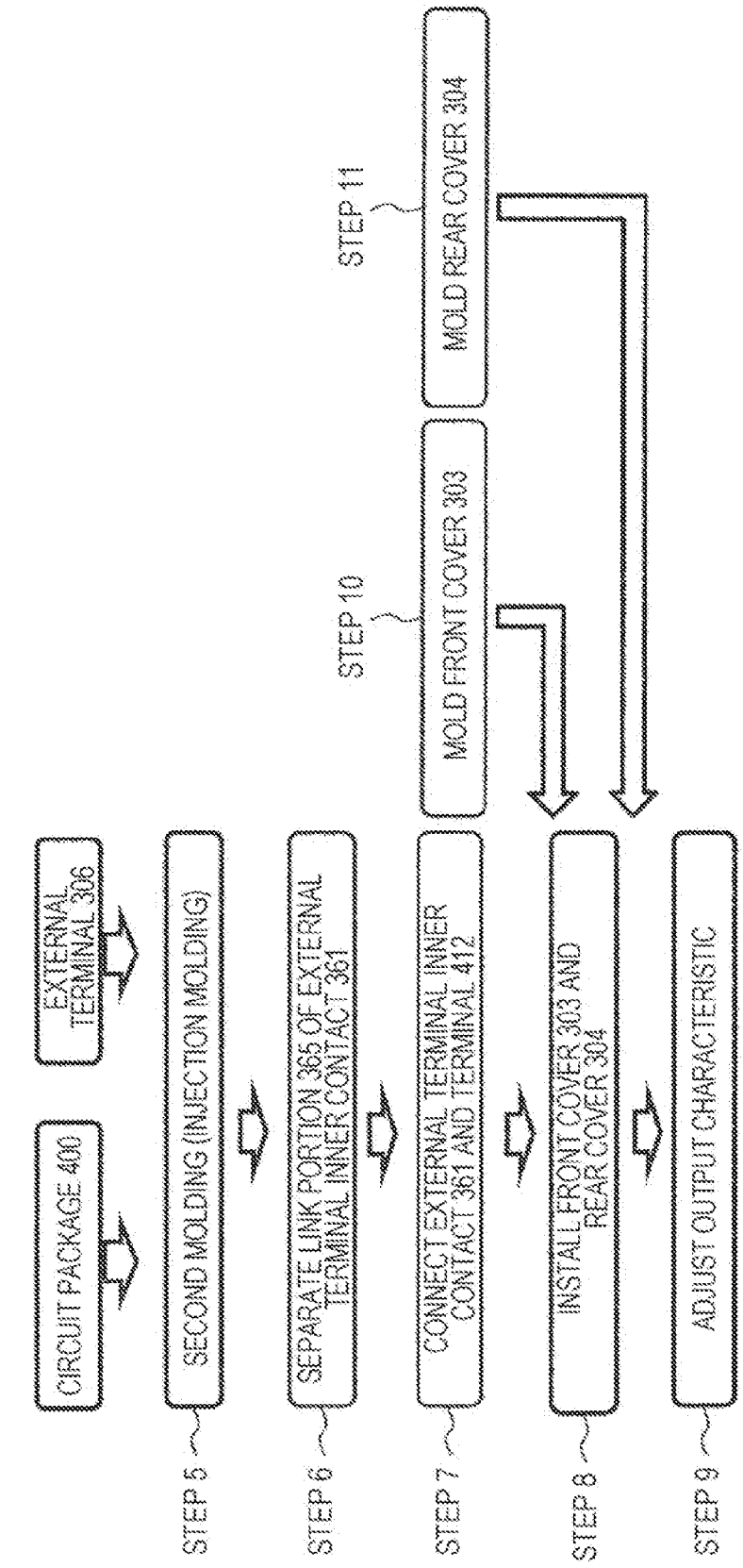

THERMAL FLOW METER

CROSS REFERENCE TO RELATED APPLICATIONS

This application is a continuation of U.S. application Ser. No. 14/407,123, filed Dec. 11, 2014, which is a 371 of International Application No. PCT/JP2013/065132, filed May 31, 2013, which claims priority from Japanese Patent Application No. 2012-136347, filed Jun. 15, 2012, the disclosures of which are expressly incorporated by reference herein.

TECHNICAL FIELD

The present invention relates to a thermal flow meter.

BACKGROUND ART

A thermal flow meter that measure a flow rate of gas is configured to include an air flow sensing portion for measuring a flow rate, such that a flow rate of the gas is measured by performing heat transfer between the air flow sensing portion and the gas as a measurement target. The flow rate measured by the thermal flow meter is widely used as an important control parameter for various devices. The thermal flow meter is characterized in that a flow rate of gas such as a mass flow rate can be measured with relatively high accuracy, compared to other types of flow meters.

However, it is desirable to further improve the measurement accuracy of the gas flow rate. For example, in a vehicle where an internal combustion engine is mounted, demands for fuel saving or exhaust gas purification are high. In order to satisfy such demands, it is desirable to measure the intake air amount which is a main parameter of the internal combustion engine with high accuracy. The thermal flow meter that measures the intake air amount guided to the internal combustion engine has a bypass passage that takes apart of the intake air amount and an air flow sensing portion arranged in the bypass passage. The air flow sensing portion measures a state of the measurement target gas flowing through the bypass passage by performing heat transfer with the measurement target gas and outputs an electric signal representing the intake air amount guided to the internal combustion engine. This technique is discussed, for example, in JP 2011-252796 A (PTL 1).

Then, JP 2010-197102 A (PTL 2) discloses a structure of a flow sensor device which is formed by mounting a circuit chip and a sensor chip on a lead, sealing with a mold resin, and cutting off a support frame.

CITATION LIST

Patent Literature

PTL 1: JP 2011-252796 A
PTL 2: JP 2010-197102 A

SUMMARY OF INVENTION

Technical Problem

In the flow sensor device disclosed in the Patent Literature 2, a cut end portion of the lead from which the support frame has been cut off is exposed from the mold resin. Accordingly, for example when the flow sensor device is installed in an intake passage of an internal combustion engine and used in the measurement of the flow rate of a measurement target gas passing through the intake passage, water or salt water mixed into the measurement target gas is adhered to the cut end portion, whereby the lead may be eroded. Alternatively, the water or the saltwater infiltrates into the device through the cut end portion, whereby the circuit chip and the sensor chip may be eroded.

In view of the above problems, the present invention provides a thermal flow meter which can prevent water or salt water from being adhered to a cut end portion exposed from a mold resin of a circuit package.

Solution to Problem

In order to solve the above problems, a thermal flow meter of the present invention is a thermal flow meter having a circuit package formed by mounting a detection element on a lead supported by a support frame, sealing with a mold resin, and cutting off the support frame, wherein a cut end portion of the lead exposed from the mold resin of the circuit package by cutting off the support frame is covered by a covering portion.

Advantageous Effects of Invention

According to the thermal flow meter of the present invention, water or the like can be prevented from being adhered to a cut end portion of a lead, and erosion of the lead and intrusion of water or the like into a circuit package can be prevented. Other objects, constitutions, and effects of the invention will be apparent from the following description of the following embodiments.

BRIEF DESCRIPTION OF DRAWINGS

FIGS. 2A and 2B are diagrams illustrating an appearance of the thermal flow meter, in which FIG. 2A is a left side view, and FIG. 2B is a front view.

FIGS. 3A and 3B are diagrams illustrating an appearance of the thermal flow meter, in which FIG. 3A is a right side view, and FIG. 3B is a rear view.

FIGS. 4A and 4B are diagrams illustrating an appearance of the thermal flow meter, in which FIG. 4A is a plan view, and FIG. 4B is a bottom view.

FIG. 5A is a left side view of a housing of the thermal flow meter.

FIG. 5B is a front view of the housing of the thermal flow meter.

FIGS. 6A and 6B are diagrams illustrating the housing of the thermal flow meter, in which FIG. 6A is a right side view of the housing, and FIG. 6B is a rear view of the housing.

FIGS. 8A to 8C are exterior views illustrating a circuit package, in which FIG. 8A is a left side view, FIG. 8B is a front view, and FIG. 8C is a rear view.

FIG. 10 is an explanatory diagram illustrating a diaphragm and a link channel that connects an opening and a gap inside the diaphragm.

FIG. 11 is a diagram illustrating a condition of the circuit package after a first resin molding process.

FIGS. 12A and 12B are enlarged views for explaining a specific example of a constitution in which a protrusion of the thermal flow meter is covered by a covering portion.

FIGS. 13A and 13B are enlarged views for explaining another specific example of the constitution in which the protrusion of the thermal flow meter is covered by a covering portion.

FIG. 15A is a diagram illustrating an overview of a manufacturing process of a thermal flow meter and a production process of the circuit package.

FIG. 15B is a diagram illustrating an overview of a manufacturing process of the thermal flow meter and a production process of the circuit package.

DESCRIPTION OF EMBODIMENTS

Figure 1:
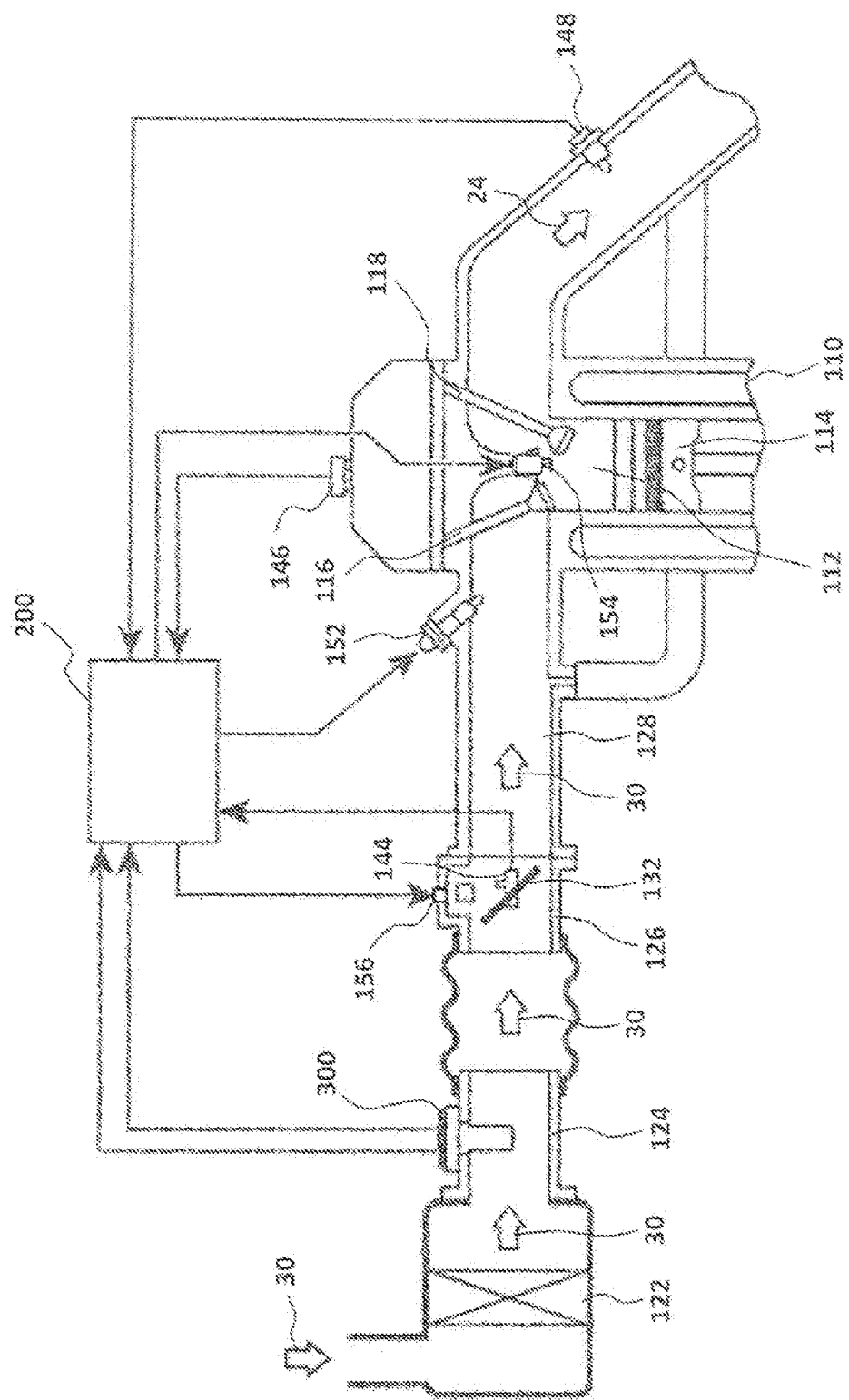
FIG. 1 is a system diagram illustrating an internal combustion engine control system where a thermal flow meter according to an embodiment of the invention is used.

Examples for embodying the invention described below (hereinafter, referred to as embodiments) solves various problems desired as a practical product. In particular, the embodiments solve various problems for use in a measurement device for measuring an intake air amount of a vehicle and exhibit various effects. One of various problems addressed by the following embodiments is described in the "Problems to Be Solved by the Invention" described above, and one of various effects obtained by the following embodiments is described in the "Effects of the Invention." Various problems solved by the following embodiments and various effects obtained by the following embodiments will be further described in the "Description of Embodiments." Therefore, it would be appreciated that the following embodiments also include other effects or problems obtained or addressed by the embodiments than those described in "Problems to Be Solved by the Invention" or "Effects of the Invention."

In the following embodiments, like reference numerals denote like elements even when they are inserted in different drawings, and they have the same functional effects. The components that have been described in previous paragraphs may not be described by denoting reference numerals and signs in the drawings.

1. Internal Combustion Engine Control System Having Thermal Flow Meter According to One Embodiment of the Invention FIG. 1 is a system diagram illustrating an electronic fuel injection type internal combustion engine control system having a thermal flow meter according to one embodiment of the invention. Based on the operation of an internal combustion engine 110 having an engine cylinder 112 and an engine piston 114, an intake air as a measurement target gas 30 is inhaled from an air cleaner 122 and is guided to a combustion chamber of the engine cylinder 112 through a main passage 124 including, for example, an intake body, a throttle body 126, and an intake manifold 128. A flow rate of the measurement target gas 30 as an intake air guided to the combustion chamber is measured by a thermal flow meter 300 according to the invention. A fuel is supplied from a fuel injection valve 152 based on the measured flow rate and is mixed with the measurement target gas 30 as an intake air, so that the mixed gas is guided to the combustion chamber. It is noted that, in this embodiment, the fuel injection valve 152 is provided in an intake port of the internal combustion engine, and the fuel injected to the intake port is mixed with the measurement target gas 30 as an intake air to form a mixed gas, so that the mixed gas is guided to the combustion chamber through an intake valve 116 to generate mechanical energy by burning.

In recent years, in many vehicles, a direct fuel injection method having excellent effects in exhaust gas purification or fuel efficiency improvement is employed, in which a fuel injection valve 152 is installed in a cylinder head of the internal combustion engine, and fuel is directly injected into each combustion chamber from the fuel injection valve 152. The thermal flow meter 300 may be similarly used in a type in which fuel is directly injected into each combustion chamber as well as a type in which fuel is injected into the intake port of the internal combustion engine of FIG. 1. A method of measuring control parameters, including a method of using the thermal flow meter 300, and a method of controlling the internal combustion engine, including a fuel supply amount or an ignition timing, are similar in basic concept between both types. A representative example of both types, a type in which fuel is injected into the intake port is illustrated in FIG. 1.

The fuel and the air guided to the combustion chamber have a fuel/air mixed state and are explosively combusted by spark ignition of the ignition plug 154 to generate mechanical energy. The gas after combustion is guided to an exhaust pipe from the exhaust valve 118 and is discharged to the outside of the vehicle from the exhaust pipe as an exhaust gas 24. The flow rate of the measurement target gas 30 as an intake air guided to the combustion chamber is controlled by the throttle valve 132 of which opening level changes in response to manipulation of an accelerator pedal. The fuel supply amount is controlled based on the flow rate of the intake air guided to the combustion chamber, and a driver controls an opening level of the throttle valve 132, so that the flow rate of the intake air guided to the combustion chamber is controlled. As a result, it is possible to control mechanical energy generated by the internal combustion engine.

1.1 Overview of Control of Internal Combustion Engine Control System

The flow rate and the temperature of the measurement target gas 30 as an intake air that is received from the air cleaner 122 and flows through the main passage 124 are measured by the thermal flow meter 300, and an electric signal representing the flow rate and the temperature of the intake air is input to the control device 200 from the thermal flow meter 300. In addition, an output of the throttle angle sensor 144 that measures an opening level of the throttle valve 132 is input to the control device 200, and an output of a rotation angle sensor 146 is input to the control device 200 to measure a position or a condition of the engine piston 114, the intake valve 116, or the exhaust valve 118 of the internal combustion engine and a rotational speed of the internal combustion engine. In order to measure a mixed ratio state between the fuel amount and the air amount from the condition of exhaust gas 24, an output of an oxygen sensor 148 is input to the control device 200.

The control device 200 computes a fuel injection amount or an ignition timing based on a flow rate of the intake air as an output of the thermal flow meter 300 and a rotational speed of the internal combustion engine measured from an output of the rotation angle sensor 146. Based on the computation result of them, a fuel amount supplied from the fuel injection valve 152 and an ignition timing for igniting the ignition plug 154 are controlled. In practice, the fuel supply amount or the ignition timing is further accurately controlled based on a change of the intake temperature or the throttle angle measured by the thermal flow meter 300, a change of the engine rotation speed, and an air-fuel ratio state measured by the oxygen sensor 148. In the idle driving state of the internal combustion engine, the control device 200 further controls the air amount bypassing the throttle valve 132 using an idle air control valve 156 and controls a rotation speed of the internal combustion engine under the idle driving state.

1.2 Importance of Improvement of Measurement Accuracy of Thermal Flow Meter and Environment for Mounting Thermal Flow Meter Both the fuel supply amount and the ignition timing as a main control amount of the internal combustion engine are computed by using an output of the thermal flow meter 300 as a main parameter. Therefore, improvement of the measurement accuracy, suppression of aging, and improvement of reliability of the thermal flow meter 300 are important for improvement of control accuracy of a vehicle or obtainment of reliability. In particularly, in recent years, there are a lot of demands for fuel saving of vehicles and exhaust gas purification. In order to satisfy such demands, it is significantly important to improve the measurement accuracy of the flow rate of the measurement target gas 30 as an intake air measured by the thermal flow meter 300. In addition, it is also important to maintain high reliability of the thermal flow meter 300.

A vehicle having the thermal flow meter 300 is used under an environment where a temperature change is significant or a coarse weather such as a storm or snow. When a vehicle travels a snowy road, it travels through a road on which an anti-freezing agent is sprayed. It is preferable that the thermal flow meter 300 be designed considering a countermeasure for the temperature change or a countermeasure for dust or pollutants under such a use environment. Furthermore, the thermal flow meter 300 is installed under an environment where the internal combustion engine is subjected to vibration. It is also desired to maintain high reliability for vibration.

The thermal flow meter 300 is installed in the intake pipe influenced by heat from the internal combustion engine. For this reason, the heat generated from the internal combustion engine is transferred to the thermal flow meter 300 via the intake pipe which is a main passage 124. Since the thermal flow meter 300 measures the flow rate of the measurement target gas by transferring heat with the measurement target gas, it is important to suppress influence of the heat from the outside as much as possible.

The thermal flow meter 300 mounted on a vehicle solves the problems described in "Problems to Be Solved by the Invention" and provides the effects described in "Effects of the Invention" as described below. In addition, as described below, it solves various problems demanded as a product and provides various effects considering various problems described above. Specific problems or effects solved or provided by the thermal flow meter 300 will be described in the following description of embodiments.

2. Configuration of Thermal Flow Meter 300

2.1 Exterior Structure of Thermal Flow Meter 300

FIGS. 2(A), 2(B), 3(A), 3(B), 4(A), and 4(B) are diagrams illustrating the exterior of the thermal flow meter 300, in which FIG. 2(A) is left side view of the thermal flow meter 300, FIG. 2(B) is a front view, FIG. 3(A) is a right side view, FIG. 3(B) is a rear view, FIG. 4(A) is a plan view, and FIG. 4(B) is a bottom view. The thermal flow meter 300 includes a housing 302, a front cover 303, and a rear cover 304. The housing 302 includes a flange 312 for fixing the thermal flow meter 300 to an intake body as a main passage 124, an external connector 305 having an external terminal 306 for electrical connection to external devices, and a measuring portion 310 for measuring a flow rate and the like. The measuring portion 310 is internally provided with a bypass passage trench for making a bypass passage. In addition, the measuring portion 310 is internally provided with a circuit package 400 having an air flow sensing portion 602 (refer to FIG. 16) for measuring a flow rate of the measurement target gas 30 flowing through the main passage 124 or a temperature detecting portion 452 for measuring a temperature of the measurement target gas 30 flowing through the main passage 124.

2.2 Effects Based on Exterior Structure of Thermal Flow Meter 300

Since the inlet port 350 of the thermal flow meter 300 is provided in the leading end side of the measuring portion 310 extending toward the center direction of the main passage 124 from the flange 312, the gas in the vicinity of the center portion distant from the inner wall surface instead of the vicinity of the inner wall surface of the main passage 124 may be input to the bypass passage. For this reason, the thermal flow meter 300 can measure a flow rate or a temperature of the air distant from the inner wall surface of the main passage 124 of the thermal flow meter 300, so that it is possible to suppress a decrease of the measurement accuracy caused by influence of heat and the like. In the vicinity of the inner wall surface of the main passage 124, the thermal flow meter 300 is easily influenced by the temperature of the main passage 124, so that the temperature of the measurement target gas 30 has a different condition from an original temperature of the gas and exhibits a condition different from an average condition of the main gas inside the main passage 124. In particular, if the main passage 124 serves as an intake body of the engine, it may be influenced by the heat from the engine and remains in a high temperature. For this reason, the gas in the vicinity of the inner wall surface of the main passage 124 has a temperature higher than the original temperature of the main passage 124 in many cases, so that this degrades the measurement accuracy.

In the vicinity of the inner wall surface of the main passage 124, a fluid resistance increases, and a flow velocity decreases, compared to an average flow velocity in the main passage 124. For this reason, if the gas in the vicinity of the inner wall surface of the main passage 124 is input to the bypass passage as the measurement target gas 30, a decrease of the flow velocity against the average flow velocity in the main passage 124 may generate a measurement error. In the thermal flow meter 300 illustrated in FIGS. 2(A) to 4(B), since the inlet port 350 is provided in the leading end of the thin and long measuring portion 310 extending to the center of the main passage 124 from the flange 312, it is possible to reduce a measurement error relating to a decrease of the flow velocity in the vicinity of the inner wall surface. In the thermal flow meter 300 illustrated in FIGS. 2(A) to 4(B), in addition to the inlet port 350 provided in the leading end of the measuring portion 310 extending to the center of the main passage 124 from the flange 312, an outlet port of the bypass passage is also provided in the leading end of the measuring portion 310. Therefore, it is possible to further reduce the measurement error.

The measuring portion 310 of the thermal flow meter 300 has a shape extending from the flange 312 to the center direction of the main passage 124, and its leading end is provided with the inlet port 350 for inputting apart of the measurement target gas 30 such as an intake air to the bypass passage and the outlet port 352 for returning the measurement target gas 30 from the bypass passage to the main passage 124. While the measuring portion 310 has a shape extending along an axis directed to the center from the outer wall of the main passage 124, its width has a narrow shape as illustrated in FIGS. 2(A) and 3(A). That is, the measuring portion 310 of the thermal flow meter 300 has a front surface having an approximately rectangular shape and a side surface having a thin width. As a result, the thermal flow meter 300 can have a bypass passage having a sufficient length, and it is possible to suppress a fluid resistance to a small value for the measurement target gas 30. For this reason, using the thermal flow meter 300, it is possible to suppress the fluid resistance to a small value and measure the flow rate of the measurement target gas 30 with high accuracy.

2.3 Structure of Temperature Detecting Portion 452

The inlet port 343 is positioned in the flange 312 side from the bypass passage provided in the leading end side of the measuring portion 310 and is opened toward an upstream side of the flow of the measurement target gas 30 as illustrated in FIGS. 2(A) to 3(B). Inside the inlet port 343, a temperature detecting portion 452 is arranged to measure a temperature of the measurement target gas 30. In the center of the measuring portion 310 where the inlet port 343 is provided, an upstream-side outer wall inside the measuring portion 310 included the housing 302 is hollowed toward the downstream side, the temperature detecting portion 452 is formed to protrude toward the upstream side from the upstream-side outer wall having the hollow shape. In addition, front and rear covers 303 and 304 are provided in both sides of the outer wall having a hollow shape, and the upstream side ends of the front and rear covers 303 and 304 are formed to protrude toward the upstream side from the outer wall having the hollow shape. For this reason, the outer wall having the hollow shape and the front and rear covers 303 and 304 in its both sides form the inlet port 343 for receiving the measurement target gas 30. The measurement target gas 30 received from the inlet port 343 makes contact with the temperature detecting portion 452 provided inside the inlet port 343 to measure the temperature of the temperature detecting portion 452. Furthermore, the measurement target gas 30 flows along a portion that supports the temperature detecting portion 452 protruding from the outer wall of the housing 302 having a hollow shape to the upstream side, and is discharged to the main passage 124 from a front side outlet port 344 and a rear side outlet port 345 provided in the front and rear covers 303 and 304.

2.4 Effects Relating to Temperature Detecting Portion 452

A temperature of the gas flowing to the inlet port 343 from the upstream side of the direction along the flow of the measurement target gas 30 is measured by the temperature detecting portion 452. Furthermore, the gas flows toward a neck portion of the temperature detecting portion 452 for supporting the temperature detecting portion 452, so that it lowers the temperature of the portion for supporting the temperature detecting portion 452 to the vicinity of the temperature of the measurement target gas 30. The temperature of the intake pipe serving as a main passage 124 typically increases, and the heat is transferred to the portion for supporting the temperature detecting portion 452 through the upstream-side outer wall inside the measuring portion 310 from the flange 312 or the thermal insulation 315, so that the temperature measurement accuracy may be influenced. The aforementioned support portion is cooled as the measurement target gas 30 is measured by the temperature detecting portion 452 and then flows along the support portion of the temperature detecting portion 452. Therefore, it is possible to suppress the heat from being transferred to the portion for supporting the temperature detecting portion 452 through the upstream-side outer wall inside the measuring portion 310 from the flange 312 or the thermal insulation 315.

In particular, in the support portion of the temperature detecting portion 452, the upstream-side outer wall inside the measuring portion 310 has a shape concave to the downstream side (as described below with reference to FIGS. 5(A) to 6(B)). Therefore, it is possible to increase a length between the upstream-side outer wall inside the measuring portion 310 and the temperature detecting portion 452. While the heat conduction length increases, a length of the cooling portion using the measurement target gas 30 increases. Therefore, it is possible to also reduce influence of the heat from the flange 312 or the thermal insulation 315. Accordingly, the measurement accuracy is improved. Since the upstream-side outer wall has a shape concaved to the downstream side (as described below with reference to FIGS. 5(A) to 6(B)), it is possible to easily fix the circuit package 400 (refer to FIGS. 5(A) to 6(B)) described below.

2.5 Structures and Effects of Upstream-Side Side Surface and Downstream-Side Side Surface of Measuring Portion 310

An upstream-side protrusion 317 and a downstream-side protrusion 318 are provided in the upstream-side side surface and the downstream-side side surface, respectively, of the measuring portion 310 included in the thermal flow meter 300. The upstream-side protrusion 317 and the downstream-side protrusion 318 have a shape narrowed along the leading end to the base, so that it is possible to reduce a fluid resistance of the measurement target gas 30 as an intake air flowing through the main passage 124. The upstream-side protrusion 317 is provided between the thermal insulation 315 and the inlet port 343. The upstream-side protrusion 317 has a large cross section and receives a large heat conduction from the flange 312 or the thermal insulation 315. However, the upstream-side protrusion 317 is cut near the inlet port 343, and a length of the temperature detecting portion 452 from the temperature detecting portion 452 of the upstream-side protrusion 317 increases due to the hollow of the upstream-side outer wall of the housing 302 as described below. For this reason, the heat conduction is suppressed from the thermal insulation 315 to the support portion of the temperature detecting portion 452.

A gap including the terminal connector 320 and the terminal connector 320 described below is formed between the flange 312 or the thermal insulation 315 and the temperature detecting portion 452. For this reason, a distance between the flange 312 or the thermal insulation 315 and the temperature detecting portion 452 increases, and the front cover 303 or the rear cover 304 is provided in this long portion, so that this portion serves as a cooling surface. Therefore, it is possible to reduce influence of the temperature of the wall surface of the main passage 124 to the temperature detecting portion 452. In addition, as the distance between the flange 312 or the thermal insulation 315 and the temperature detecting portion 452 increases, it is possible to guide a part of the measurement target gas 30 input to the bypass passage to the vicinity of the center of the main passage 124. It is possible to suppress a decrease of the measurement accuracy caused by heat transfer from the wall surface of the main passage 124.

As illustrated in FIG. 2(B) or 3(B), both side surfaces of the measuring portion 310 inserted into the main passage 124 have a very narrow shape, and a leading end of the downstream-side protrusion 318 or the upstream-side protrusion 317 has a narrow shape relative to the base where the air resistance is reduced. For this reason, it is possible to suppress an increase of the fluid resistance caused by insertion of the thermal flow meter 300 into the main passage 124. Furthermore, in the portion where the downstream-side protrusion 318 or the upstream-side protrusion 317 is provided, the upstream-side protrusion 317 or the downstream-side protrusion 318 protrudes toward both sides relative to both side portions of the front cover 303 or the rear cover 304. Since the upstream-side protrusion 317 or the downstream-side protrusion 318 is formed of a resin molding, they are easily formed in a shape having an insignificant air resistance. Meanwhile, the front cover 303 or the rear cover 304 is shaped to have a wide cooling surface. For this reason, the thermal flow meter 300 has a reduced air resistance and can be easily cooled by the measurement target gas flowing through the main passage 124.

2.6 Structures and Effects of External Connector 305 and Flange 312

FIG. 4(A) is a plan view illustrating the thermal flow meter 300. Four external terminal 306 and a calibration terminal 307 are provided inside the external connector 305. The external terminals 306 include terminals for outputting the flow rate and the temperature as a measurement result of the thermal flow meter 300 and a power terminal for supplying DC power for operating the thermal flow meter 300. The calibration terminal 307 is used to measures the produced thermal flow meter 300 to obtain a calibration value of each thermal flow meter 300 and store the calibration value in an internal memory of the thermal flow meter 300. In the subsequent measurement operation of the thermal flow meter 300, the calibration data representing the calibration value stored in the memory is used, and the calibration terminal 307 is not used. Therefore, in order to prevent the calibration terminal 307 from hindering connection between the external terminals 306 and other external devices, the calibration terminal 307 has a shape different from that of the external terminal 306. In this embodiment, since the calibration terminal 307 is shorter than the external terminal 306, the calibration terminal 307 does not hinder connection even when the connection terminal connected to the external terminal 306 for connection to external devices is inserted into the external connector 305. In addition, since a plurality of hollows 308 are provided along the external terminal 306 inside the external connector 305, the hollows 308 reduce stress concentration caused by shrinkage of resin when the resin as a material of the flange 312 is cooled and solidified.

Since the calibration terminal 307 is provided in addition to the external terminal 306 used during the measurement operation of the thermal flow meter 300, it is possible to measure characteristics of each thermal flow meter 300 before shipping to obtain a variation of the product and store a calibration value for reducing the variation in the internal memory of the thermal flow meter 300. The calibration terminal 307 is formed in a shape different from that of the external terminal 306 in order to prevent the calibration terminal 307 from hindering connection between the external terminal 306 and external devices after the calibration value setting process. In this manner, using the thermal flow meter 300, it is possible to reduce a variation of each thermal flow meter 300 before shipping and improve measurement accuracy.

3. Entire Structure of Housing 302 and its Effects 3.1 Structures and Effects of Bypass Passage and Air Flow Sensing Portion FIGS. 5(A) to 6(B) illustrate a state of the housing 302 when the front and rear covers 303 and 304 are removed from the thermal flow meter 300. FIG. 5(A) is a left side view illustrating the housing 302, FIG. 5(B) is a front view illustrating the housing 302, FIG. 6(A) is a right side view illustrating the housing 302, and FIG. 6(B) is a rear view illustrating the housing 302. In the housing 302, the measuring portion 310 extends from the flange 312 to the center direction of the main passage 124, and a bypass passage trench for forming the bypass passage is provided in its leading end side. In this embodiment, the bypass passage trench is provided on both frontside and backside of the housing 302. FIG. 5(B) illustrates a bypass passage trench on frontside 332, and FIG. 6(B) illustrates a bypass passage trench on backside 334. Since an inlet trench 351 for forming the inlet port 350 of the bypass passage and an outlet trench 353 for forming the outlet port 352 are provided in the leading end of the housing 302, the gas distant from the inner wall surface of the main passage 124, that is, the gas flow through the vicinity of the center of the main passage 124 can be received as the measurement target gas 30 from the inlet port 350. The gas flowing through the vicinity of the inner wall surface of the main passage 124 is influenced by the temperature of the wall surface of the main passage 124 and has a temperature different from the average temperature of the gas flowing through the main passage 124 such as the intake air in many cases. In addition, the gas flowing through the vicinity of the inner wall surface of the main passage 124 has a flow velocity lower than the average flow velocity of the gas flowing through the main passage 124 in many cases. Since the thermal flow meter 300 according to the embodiment is resistant to such influence, it is possible to suppress a decrease of the measurement accuracy.

The bypass passage formed by the bypass passage trench on frontside 332 or the bypass passage trench on backside 334 described above is connecter to the thermal insulation 315 through the outer wall hollow portion 366, the upstream-side outer wall 335, or the downstream-side outer wall 336. In addition, the upstream-side outer wall 335 is provided with the upstream-side protrusion 317, and the downstream-side outer wall 336 is provided with the downstream-side protrusion 318. In this structure, since the thermal flow meter 300 is fixed to the main passage 124 using the flange 312, the measuring portion 310 having the circuit package 400 is fixed to the main passage 124 with high reliability.

In this embodiment, the housing 302 is provided with the bypass passage trench for forming the bypass passage, and the covers are installed on the frontside and backside of the housing 302, so that the bypass passage is formed by the bypass passage trench and the covers. In this structure, it is possible to form overall bypass passage trenches as a part of the housing 302 in the resin molding process of the housing 302. In addition, since the dies are provided in both surfaces of the housing 302 during formation of the housing 302, it is possible to form both the bypass passage trench on frontside 332 and bypass passage trench on backside 334 as a part of the housing 302 by using the dies for both the surfaces. Since the front and rear covers 303 and 304 are provided in both the surfaces of the housing 302, it is possible to obtain the bypass passages in both surfaces of the housing 302. Since the front and bypass passage trench on frontside 332 and bypass passage trenches on backside 334 are formed on both the surfaces of the housing 302 using the dies, it is possible to form the bypass passage with high accuracy and obtain high productivity.

Referring to FIG. 6(B), a part of the measurement target gas 30 flowing through the main passage 124 is input to the inside of the bypass passage trench on backside 334 from the inlet trench 351 that forms the inlet port 350 and flows through the inside of the bypass passage trench on backside 334. The bypass passage trench on backside 334 gradually deepens as the gas flows, and the measurement target gas 30 slowly moves to the front direction as it flows along the trench. In particular, the bypass passage trench on backside 334 is provided with a steep slope portion 347 that steeply deepens to the upstream portion 342 of the circuit package 400, so that a part of the air having a light mass moves along the steep slope portion 347 and then flows through the side of the measurement surface 430 illustrated in FIG. 5(B) in the upstream portion 342 of the circuit package 400. Meanwhile, since a foreign object having a heavy mass has difficulty in steeply changing its path due to a centrifugal force, it moves to the side of the backside of measurement surface 431 illustrated in FIG. 6(B). Then, the foreign object flows to the measurement surface 430 illustrated in FIG. 5(B) through the downstream portion 341 of the circuit package 400.

A flow of the measurement target gas 30 in the vicinity of the heat transfer surface exposing portion 436 will be described with reference to FIG. 7. In the bypass passage trench on frontside 332 of FIG. 5(B), the air as a measurement target gas 30 moving from the upstream portion 342 of the circuit package 400 to the bypass passage trench on frontside 332 side flows along the measurement surface 430, and heat transfer is performed with the air flow sensing portion 602 for measuring a flow rate using the heat transfer surface exposing portion 436 provided in the measurement surface 430 in order to measure a flow rate. Both the measurement target gas 30 passing through the measurement surface 430 or the air flowing from the downstream portion 341 of the circuit package 400 to the bypass passage trench on frontside 332 flow along the bypass passage trench on frontside 332 and are discharged from the outlet trench 353 for forming the outlet port 352 to the main passage 124.

A substance having a heavy mass such as a contaminant mixed in the measurement target gas 30 has a high inertial force and has difficulty in steeply changing its path to the deep side of the trench along the surface of the steep slope portion 347 of FIG. 6(B) where a depth of the trench steeply deepens. For this reason, since a foreign object having a heavy mass moves through the side of the backside of measurement surface 431, it is possible to suppress the foreign object from passing through the vicinity of the heat transfer surface exposing portion 436. In this embodiment, since most of foreign objects having a heavy mass other than the gas pass through the backside of measurement surface 431 which is a rear surface of the measurement surface 430, it is possible to reduce influence of contamination caused by a foreign object such as an oil component, carbon, or a contaminant and suppress degradation of the measurement accuracy. That is, since the path of the measurement target gas 30 steeply changes along an axis across the flow axis of the main passage 124, it is possible to reduce influence of a foreign object mixed in the measurement target gas 30.

In this embodiment, the flow path including the bypass passage trench on backside 334 is directed to the flange from the leading end of the housing 302 along a curved line, and the gas flowing through the bypass passage in the side closest to the flange flows reversely to the flow of the main passage 124, so that the bypass passage in the rear surface side as one side of this reverse flow is connected to the bypass passage formed in the front surface side as the other side. As a result, it is possible to easily fix the heat transfer surface exposing portion 436 of the circuit package 400 to the bypass passage and easily receive the measurement target gas 30 in the position close to the center of the main passage 124.

In this embodiment, there is provided a configuration in which the bypass passage trench on backside 334 and the bypass passage trench on frontside 332 are penetrated in the front and rear sides of the flow direction of the measurement surface 430 for measuring the flow rate. Meanwhile, the leading end side of the circuit package 400 is not supported by the housing 302, but has a cavity portion 382 such that the space of the upstream portion 342 of the circuit package 400 is connected to the space of the downstream portion 341 of the circuit package 400. Using the configuration penetrating the upstream portion 342 of the circuit package 400 and the downstream portion 341 of the circuit package 400, the bypass passage is formed such that the measurement target gas 30 moves from the bypass passage trench on backside 334 formed in one surface of the housing 302 to the bypass passage trench on frontside 332 formed in the other surface of the housing 302. In this configuration, it is possible to form the bypass passage trench on both surfaces of the housing 302 through a single resin molding process and perform molding with a structure for matching the bypass passage trenches on both surfaces.

By clamping both sides of the measurement surface 430 formed in the circuit package 400 using a mold die to form the housing 302, it is possible to form the configuration penetrating the upstream portion 342 of the circuit package 400 and the downstream portion 341 of the circuit package 400, perform resin molding for the housing 302, and embed the circuit package 400 in the housing 302. Since the housing 302 is formed by inserting the circuit package 400 into the die in this manner, it is possible to embed the circuit package 400 and the heat transfer surface exposing portion 436 to the bypass passage with high accuracy.

In this embodiment, a configuration penetrating the upstream portion 342 of the circuit package 400 and the downstream portion 341 of the circuit package 400 is provided. However, a configuration penetrating any one of the upstream portion 342 and the downstream portion 341 of the circuit package 400 may also be provided, and the bypass passage shape that links the bypass passage trench on backside 334 and the bypass passage trench on frontside 332 may be formed through a single resin molding process.

An inside wall of bypass passage on backside 391 and an outside wall of bypass passage on backside 392 are provided in both sides of the bypass passage trench on backside 334, and the inner side surface of the rear cover 304 abuts on the leading end portions of the height direction of each of the inside wall of bypass passage on backside 391 and the outside wall of bypass passage on backside 392, so that the bypass passage on backside is formed in the housing 302. In addition, an inside wall of bypass passage on frontside 393 and an outside wall of bypass passage on frontside 394 are provided in both sides of the bypass passage trench on frontside 332, and the inner side surface of the front cover 303 abuts on the leading end portions of the height direction of the inside wall of bypass passage on frontside 393 and the outside wall of bypass passage on frontside 394, so that the bypass passage on frontside is formed in the housing 302.

Referring to FIGS. 5(A) to 6(B), an outer wall hollow portion 366 is provided, where the upstream-side outer wall 335 has a hollow shape hollowed to the downstream side in a neck portion of the temperature detecting portion 452. Due to this outer wall hollow portion 366, a distance between the temperature detecting portion 452 and the outer wall hollow portion 366 increases, so that it is possible to reduce influence of the heat transferred via the upstream-side outer wall 335.

Although the circuit package 400 is enveloped by the fixing portion 372 for fixation of the circuit package 400, it is possible to increase a force for fixing the circuit package 400 by further fixing the circuit package 400 using the outer wall hollow portion 366. The fixing portion 372 envelopes the circuit package 400 along a flow axis of the measurement target gas 30. Meanwhile, the outer wall hollow portion 366 envelops the circuit package 400 across the flow axis of the measurement target gas 30. That is, the circuit package 400 is enveloped such that the enveloping direction is different with respect to the fixing portion 372. Since the circuit package 400 is enveloped along the two different directions, the fixing force is increased. Although the outer wall hollow portion 366 is a part of the upstream-side outer wall 335, the circuit package 400 may be enveloped in a direction different from that of the fixing portion 372 using the downstream-side outer wall 336 instead of the upstream-side outer wall 335 in order to increase the fixing force. For example, a plate portion of the circuit package 400 may be enveloped by the downstream-side outer wall 336, or the circuit package 400 may be enveloped using a hollow hollowed in the upstream direction or a protrusion protruding to the upstream direction provided in the downstream-side outer wall 336. Since the outer wall hollow portion 366 is provided in the upstream-side outer wall 335 to envelop the circuit package 400, it is possible to provide an effect of increasing a thermal resistance between the temperature detecting portion 452 and the upstream-side outer wall 335 in addition to fixation of the circuit package 400.

Since the outer wall hollow portion 366 is provided in a neck portion of the temperature detecting portion 452, it is possible to reduce influence of the heat transferred from the flange 312 or the thermal insulation 315 through the upstream-side outer wall 335. Furthermore, a temperature measurement hollow 368 formed by a notch between the upstream-side protrusion 317 and the temperature detecting portion 452 is provided. Using the temperature measurement hollow 368, it is possible to reduce heat transfer to the temperature detecting portion 452 through the upstream-side protrusion 317. As a result, it is possible to improve detection accuracy of the temperature detecting portion 452. In particular, since the upstream-side protrusion 317 has a large cross section, it easily transfers heat, and a functionality of the temperature measurement hollow 368 that suppress heat transfer becomes important.

3.2 Structure and Effects of Air Flow Sensing Portion of Bypass Passage

Figure 7:
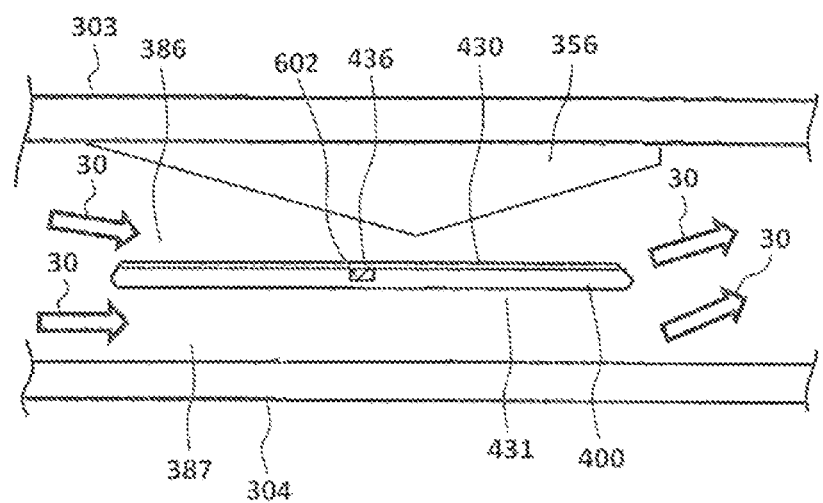
FIG. 7 is a partially enlarged view illustrating a state of a flow path surface arranged in a bypass passage.

FIG. 7 is partially enlarged view illustrating a state that the measurement surface 430 of the circuit package 400 is arranged inside the bypass passage trench as a cross-sectional view taken along the line A-A of FIGS. 6(A) and 6(B). It is noted that FIG. 7 is a conceptual diagram omitted and simplified compared to the specific configuration of FIGS. 5(A) to 5(D) or FIGS. 6(A) and 6(B), and details may be slightly modified. The left side of FIG. 7 is a terminated end portion of the bypass passage trench on backside 334, and the right side is a starting end portion of the bypass passage trench on frontside 332. Although not illustrated clearly in FIG. 7, penetrating portions are provided in both the left and right sides of the circuit package 400 having the measurement surface 430, and the bypass passage trench on backside 334 and the bypass passage trench on frontside 332 are connected to the left and right sides of the circuit package 400 having the measurement surface 430.

The measurement target gas 30 that is received from the inlet port 350 and flows through the bypass passage on backside including the bypass passage trench on backside 334 is guided from the left side of FIG. 7. Apart of the measurement target gas 30 flows to a flow path 386 including the front side of the measurement surface 430 of the circuit package 400 and the protrusion 356 provided in the front cover 303 through the penetrating portion of the upstream portion 342 of the circuit package 400. The other measurement target gas 30 flows to a flow path 387 formed by the backside of measurement surface 431 and the rear cover 304. Then, the measurement target gas 30 flowing through the flow path 387 moves to the bypass passage trench on frontside 332 through the penetrating portion of the downstream portion 341 of the circuit package 400 and is combined with the measurement target gas 30 flowing through the flow path 386, so that it flows through the bypass passage trench on frontside 332 and is discharged from the outlet port 352 to the main passage 124.

Because the bypass passage trench is formed such that the flow path of the measurement target gas 30 guided to the flow path 386 through the penetrating portion of the upstream portion 342 of the circuit package 400 from the bypass passage trench on backside 334 is curved wider than the flow path guided to the flow path 387, a substance having a heavy mass such as a contaminant contained in the measurement target gas 30 is gathered in the flow path 387 being less curved. For this reason, there is nearly no flow of a foreign object into the flow path 386.

The flow path 386 is structured to form an orifice such that the front cover 303 is provided successively to the leading end portion of the bypass passage trench on frontside 332, and the protrusion 356 smoothly protrudes to the measurement surface 430 side. The measurement surface 430 is arranged in one side of the orifice portion of the flow path 386 and is provided with the heat transfer surface exposing portion 436 for performing heat transfer between air flow sensing portion 602 and the measurement target gas 30. In order to perform measurement of the air flow sensing portion 602 with high accuracy, the measurement target gas 30 in the heat transfer surface exposing portion 436 preferably makes a laminar flow having a little vortex. In addition, with the flow velocity being faster, the measurement accuracy is more improved. For this reason, the orifice is formed such that the protrusion 356 provided in the front cover 303 to face the measurement surface 430 smoothly protrudes to the measurement surface 430. This orifice reduces a vortex in the measurement target gas 30 to approximate the flow to a laminar flow. Furthermore, since the flow velocity increases in the orifice portion, and the heat transfer surface exposing portion 436 for measuring the flow rate is arranged in the orifice portion, the measurement accuracy of the flow rate is improved.

Since the orifice is formed such that the protrusion 356 protrudes to the inside of the bypass passage trench to face the heat transfer surface exposing portion 436 provided on the measurement surface 430, it is possible to improve measurement accuracy. The protrusion 356 for forming the orifice is provided on the cover facing the heat transfer surface exposing portion 436 provided on the measurement surface 430. In FIG. 7, since the cover facing the heat transfer surface exposing portion 436 provided on the measurement surface 430 is the front cover 303, the protrusion 356 is provided in the front cover 303. Alternatively, the protrusion 356 may also be provided in the cover facing the heat transfer surface exposing portion 436 provided on the measurement surface 430 of the front or rear cover 303 or 304. Depending on which of the surfaces the measurement surface 430 and the heat transfer surface exposing portion 436 in the circuit package 400 are provided, the cover that faces the heat transfer surface exposing portion 436 is changed.

Referring to FIGS. 5(A) to 6(B), a press imprint 442 of the die used in the resin molding process for the circuit package 400 remains on the backside of measurement surface 431 as a rear surface of the heat transfer surface exposing portion 436 provided on the measurement surface 430. The press imprint 442 does not particularly hinder the measurement of the flow rate and does not make any problem even when the press imprint 442 remains. In addition, as described below, it is important to protect a semiconductor diaphragm of the air flow sensing portion 602 when the circuit package 400 is formed through resin molding. For this reason, pressing of the rear surface of the heat transfer surface exposing portion 436 is important. Furthermore, it is important to prevent resin that covers the circuit package 400 from flowing to the heat transfer surface exposing portion 436. For this viewpoint, the inflow of the resin is suppressed by enveloping the measurement surface 430 including the heat transfer surface exposing portion 436 using a die and pressing the rear surface of the heat transfer surface exposing portion 436 using another die. Since the circuit package 400 is made through transfer molding, a pressure of the resin is high, and pressing from the rear surface of the heat transfer surface exposing portion 436 is important. In addition, since a semiconductor diaphragm is used in the air flow sensing portion 602, a ventilation passage for a gap created by the semiconductor diaphragm is preferably formed. In order to hold and fix a plate and the like for forming the ventilation passage, pressing from the rear surface of the heat transfer surface exposing portion 436 is important.

3.3 Structure for Fixing Circuit Package 400 Using Housing 302 and Effects Thereof Next, fixation of the circuit package 400 to the housing 302 through a resin molding process will be described again with reference to FIGS. 5(A) to 6(B). The circuit package 400 is arranged in and fixed to the housing 302 such that the measurement surface 430 formed on the front surface of the circuit package 400 is arranged in a predetermined position of the bypass passage trench for forming the bypass passage, for example, a link portion between the bypass passage trench on frontside 332 and the bypass passage trench on backside 334 in the embodiment of FIGS. 5(A) to 6(B). A portion for burying and fixing the circuit package 400 into the housing 302 through a resin molding is provided as a fixing portion 372 for burying and fixing the circuit package 400 into the housing 302 in the side slightly closer to the flange 312 from the bypass passage trench. The fixing portion 372 is buried so as to cover the outer circumference of the circuit package 400 formed through the first resin molding process.

As illustrated in FIG. 5(B), the circuit package 400 is fixed by the fixing portion 372. The fixing portion 372 includes a circuit package 400 using a plane having a height adjoining the front cover 303 and a thin portion 376. By making a resin that covers a portion corresponding to the portion 376 thin, it is possible to alleviate contraction caused when a temperature of the resin is cooled during formation of the fixing portion 372 and reduce a stress concentration applied to the circuit package 400. It is possible to obtain better effects if the rear side of the circuit package 400 is formed in the shape described above as illustrated in FIG. 6(B).

The entire surface of the circuit package 400 is not covered by a resin used to form the housing 302, but a portion where the outer wall of the circuit package 400 is exposed is provided in the flange 312 side of the fixing portion 372. In the embodiment of FIGS. 5(A) to 6(B), the area of a portion exposed from the resin of the housing 302 but not enveloped by the housing 302 is larger than the area of a portion enveloped by the resin of the housing 302 out of the outer circumferential surface of the circuit package 400. Furthermore, a portion of the measurement surface 430 of the circuit package 400 is also exposed from the resin of the housing 302.

Since the circumference of the circuit package 400 is enveloped in the second resin molding process for forming the housing 302 by forming a part of the fixing portion 372 that covers the outer wall of the circuit package 400 across the entire circumference in a thin band shape, it is possible to alleviate an excessive stress concentration caused by volume contraction in the course of solidification of the fixing portion 372. The excessive stress concentration may adversely affect the circuit package 400.

In order to more robustly fix the circuit package 400 with a small area by reducing the area of a portion enveloped by the resin of the housing 302 of the outer circumferential surface of the circuit package 400, it is preferable to increase adherence of the circuit package 400 to the outer wall in the fixing portion 372. When a thermoplastic resin is used to form the housing 302, it is preferable that the thermoplastic resin be penetrated into fine unevennesses on the outer wall of the circuit package 400 while it has low viscosity, and the thermoplastic resin be solidified while it is penetrated into the fine unevennesses of the outer wall. In the resin molding process for forming the housing 302, it is preferable that the inlet port of the thermoplastic resin be provided in the fixing portion 372 and in the vicinity thereof. The viscosity of the thermoplastic resin increases as the temperature decreases, so that it is solidified. Therefore, by flowing the thermoplastic resin having a high temperature into the fixing portion 372 or from the vicinity thereof, it is possible to solidify the thermoplastic resin having low viscosity while it abuts on the outer wall of the circuit package 400. As a result, a temperature decrease of the thermoplastic resin is suppressed, and a low viscosity state is maintained, so that adherence between the circuit package 400 and the fixing portion 372 is improved.

By roughening the outer wall surface of the circuit package 400, it is possible to improve adherence between the circuit package 400 and the fixing portion 372. As a method of roughening the outer wall surface of the circuit package 400, there is known a roughening method for forming fine unevennesses on the surface of the circuit package 400, such as a satin-finish treatment, after forming the circuit package 400 through the first resin molding process. As the roughening method for forming fine unevennesses on the surface of the circuit package 400, for example, the roughening may be achieved using sand blasting. Furthermore, the roughening may be achieved through a laser machining.

A thermal expansion coefficient is different between the thermosetting resin used to form the circuit package 400 and the thermoplastic resin used to form the housing 302 having the fixing portion 372. It is preferable to prevent an excessive stress generated from this difference of the thermal expansion coefficient from being applied to the circuit package 400.

By forming the fixing portion 372 that envelops the outer circumference of the circuit package 400 in a band shape and narrowing the width of the band, it is possible to alleviate a stress caused by a difference of the thermal expansion coefficient applied to the circuit package 400. A width of the band of the fixing portion 372 is set to 10 mm or smaller, and preferably 8 mm or smaller. In this embodiment, since the outer wall hollow portion 366 as a part of the upstream-side outer wall 335 of the housing 302 as well as the fixing portion 372 envelops the circuit package 400 to fix the circuit package 400, it is possible to further reduce the width of the band of the fixing portion 372. The circuit package 400 can be fixed, for example, if the width is set to 3 mm or larger.

In order to reduce a stress caused by the difference of the thermal expansion coefficient, a portion covered by the resin used to form the housing 302 and an exposed portion without covering are provided on the surface of the circuit package 400. A plurality of portions where the surface of the circuit package 400 is exposed from the resin of the housing 302 are provided, and one of them is to the measurement surface 430 having the heat transfer surface exposing portion 436 described above. In addition, a portion exposed to a part of the flange 312 side relative to the fixing portion 372 is provided. Furthermore, the outer wall hollow portion 366 is formed to expose a portion of the upstream side relative to the outer wall hollow portion 366, and this exposed portion serves as a support portion that supports the temperature detecting portion 452. A gap is formed such that a portion of the outer surface of the circuit package 400 in the flange 312 side relative to the fixing portion 372 surrounds the circuit package 400 across its outer circumference, particularly, the side facing the flange 312 from the downstream side of the circuit package 400 and further across the upstream side of the portion close to the terminal of the circuit package 400. Since the gap is formed around the portion where the surface of the circuit package 400 is exposed, it is possible to reduce the heat amount transferred to the circuit package 400 through the flange 312 from the main passage 124 and suppress degradation of measurement accuracy caused by the heat.

A gap is formed between the circuit package 400 and the flange 312, and this gap serves as a terminal connector 320. The connection terminal 412 of the circuit package 400 and the inner socket of external terminal 361 positioned in the housing 302 side of the external terminal 306 are electrically connected to each other using this terminal connector 320 through spot welding, laser welding, and the like. The gap of the terminal connector 320 can suppress heat transfer from the housing 302 to the circuit package 400 as described above and is provided as a space that can be used to perform a connection work between the connection terminal 412 of the circuit package 400 and the inner socket of external terminal 361 of the external terminal 306.

3.4. Inspection of Finished Product Through First Resin Molding Process

In the embodiment of FIGS. 5(B) and 6(B), the number of terminals provided in the circuit package 400 is larger than the number of inner socket of external terminals 361. Out of the terminals of the circuit package 400, each of the connection terminals 412 is connected to each of the inner socket of external terminal 361, and the terminals 414 are not connected to the inner socket of external terminals 361. That is, although the terminals 414 are provided in the circuit package 400, they are not connected to the inner socket of external terminals 361.

In FIGS. 5(B) and 6(B), in addition to the connection terminal 412 connected to the inner socket of external terminal 361, the terminal 414 not connected to the inner socket of external terminal 361 is provided. After the circuit package 400 is produced through the first resin molding process, it is inspected whether or not the circuit package 400 is appropriately operated, and whether or not an abnormality in electrical connection is generated in the first resin molding process. As a result, it is possible to maintain high reliability for each circuit package 400. The terminal 414 not connected to the inner socket of external terminal 361 is used in such an inspection of the circuit package 400. Since the terminal 414 is not used after the inspection work, these unused terminal 414 may be cut out at the base of the circuit package 400 after the inspection or may be buried in the resin serving as the terminal side fixing portion 362 as illustrated in FIGS. 5(B) and 6(B). By providing the terminal 414 not connected to the inner socket of external terminal 361 in this manner, it is possible to inspect whether or not an abnormality is generated in the circuit package 400 produced through the first resin molding process and maintain high reliability.

3.5 Formation of Housing 302 Through Second Resin Molding Process and Effects Thereof In the housing 302 illustrated in FIGS. 5(A) to 6(B) described above, the circuit package 400 having the air flow sensing portion 602 or the processing unit 604 is manufactured through the first resin molding process. Then, the housing 302 having, for example, the bypass passage trench on frontside 332 or the bypass passage trench on backside 334 for forming the bypass passage where the measurement target gas 30 flows are manufactured through the second resin molding process. Through this second resin molding process, the circuit package 400 is embedded into the resin of the housing 302 and is fixed to the inside of the housing 302 through resin molding. As a result, the air flow sensing portion 602 performs heat transfer with the measurement target gas 30, so that a configuration relationship such as a positional relationship or a directional relationship between the heat transfer surface exposing portion 436 for measuring the flow rate and the bypass passage including, for example, the bypass passage trench on frontside 332 or the bypass passage trench on backside 334 can be maintained with remarkably high accuracy. In addition, it is possible to suppress an error or deviation generated in each circuit package 400 to a very small value. As a result, it is possible to remarkably improve measurement accuracy of the circuit package 400. For example, compared to a conventional method in which fixation is performed using an adhesive, it is possible to improve measurement accuracy twice or more. Since the thermal flow meter 300 is typically manufactured in large quantities, the method of using an adhesive along with strict measurement has a limitation in improvement of measurement accuracy. However, if the circuit package 400 is manufactured through the first resin molding process as in this embodiment, and the bypass passage is then formed in the second resin molding process for forming the bypass passage where the measurement target gas 30 flows while the circuit package 400 and the bypass passage are fixed, it is possible to remarkably reduce a variation of the measurement accuracy and remarkably improve the measurement accuracy of each thermal flow meter 300. This similarly applies to the embodiment of FIG. 7 as well as the embodiment of FIGS. 5(A) to 5(D) or FIGS. 6(A) and 6(B).

Further referring to the embodiment of, for example, FIGS. 5(A) to 6(B), it is possible to fix the circuit package 400 to the housing 302 such that a relationship between the bypass passage trench on frontside 332, the bypass passage trench on backside 334, and the heat transfer surface exposing portion 436 is set to a specific relationship. As a result, in each of the thermal flow meters 300 produced in large quantities, a positional relationship or a configuration relationship between the heat transfer surface exposing portion 436 of each circuit package 400 and the bypass passage can be regularly obtained with remarkably high accuracy. Since the bypass passage trench where the heat transfer surface exposing portion 436 of the circuit package 400 is fixed, for example, the bypass passage trench on frontside 332 and the bypass passage trench on backside 334 can be formed with remarkably high accuracy, a work of forming the bypass passage in this bypass passage trench is a work for covering both sides of the housing 302 using the front or rear cover 303 or 304. This work is very simple and is a work process having a few factors of degrading the measurement accuracy. In addition, the front or rear cover 303 or 304 is produced through a resin molding process having high formation accuracy. Therefore, it is possible to form the bypass passage provided in a specific relationship with the heat transfer surface exposing portion 436 of the circuit package 400 with high accuracy. In this manner, it is possible to obtain high productivity in addition to improvement of measurement accuracy.

In comparison, in the related art, the thermal flow meter was produced by fabricating the bypass passage and then bonding the measuring portion to the bypass passage using an adhesive. Such a method of using an adhesive is disadvantageous because a thickness of the adhesive is irregular, and a position or angle of the adhesive is different in each product. For this reason, there was a limitation in improvement of the measurement accuracy. If this work is performed in mass production, it is further difficult to improve the measurement accuracy.

In the embodiment according to the invention, first, the circuit package 400 having the air flow sensing portion 602 is produced through a first resin molding process, and the circuit package 400 is then fixed through resin molding while the bypass passage trench for forming the bypass passage through resin molding is formed through a second resin molding process. As a result, it is possible to form the shape of the bypass passage trench and fix the air flow sensing portion 602 to the bypass passage trench with significantly high accuracy.

A portion relating to the measurement of the flow rate, such as the heat transfer surface exposing portion 436 of the air flow sensing portion 602 or the measurement surface 430 installed in the heat transfer surface exposing portion 436, is formed on the surface of the circuit package 400. Then, the measurement surface 430 and the heat transfer surface exposing portion 436 are exposed from the resin used to form the housing 302. That is, the heat transfer surface exposing portion 436 and the measurement surface 430 around the heat transfer surface exposing portion 436 are not covered by the resin used to form the housing 302. The measurement surface 430 formed through the resin molding of the circuit package 400, the heat transfer surface exposing portion 436, or the temperature detecting portion 452 is directly used even after the resin molding of the housing 302 to measure a flow rate of the thermal flow meter 300 or a temperature. As a result, the measurement accuracy is improved.

In the embodiment according to the invention, the circuit package 400 is integratedly formed with the housing 302 to fix the circuit package 400 to the housing 302 having the bypass passage. Therefore, it is possible to fix the circuit package 400 to the housing 302 with a small fixation area. That is, it is possible to increase the surface area of the circuit package 400 that does not make contact with the housing 302. The surface of the circuit package 400 that does not make contact with the housing 302 is exposed to, for example, a gap. The heat of the intake pipe is transferred to the housing 302 and is then transferred from the housing 302 to the circuit package 400. Even if the contact area between the housing 302 and the circuit package 400 is reduced instead of enveloping the entire surface or most of the surface of the circuit package 400 with the housing 302, it is possible to maintain high reliability with high accuracy and fix the circuit package 400 to the housing 302. For this reason, it is possible to suppress heat transfer from the housing 302 to the circuit package 400 and suppress a decrease of the measurement accuracy.

In the embodiment illustrated in FIGS. 5(A) to 5(D) or FIGS. 6(A) and 6(B), the area A of the exposed surface of the circuit package 400 can be set to be equal to or larger than the area B covered by a molding material used to form the housing 302. In the embodiment, the area A is larger than the area B. As a result, it is possible to suppress heat transfer from the housing 302 to the circuit package 400. In addition, it is possible to reduce a stress generated by a difference between a thermal expansion coefficient of the thermosetting resin used to form the circuit package 400 and a thermal expansion coefficient of the thermoplastic resin used to form the housing 302.

4. Appearance of Circuit Package 400

4.1 Formation of Measurement Surface 430 Having Heat Transfer Surface Exposing Portion 436

Figure 8:
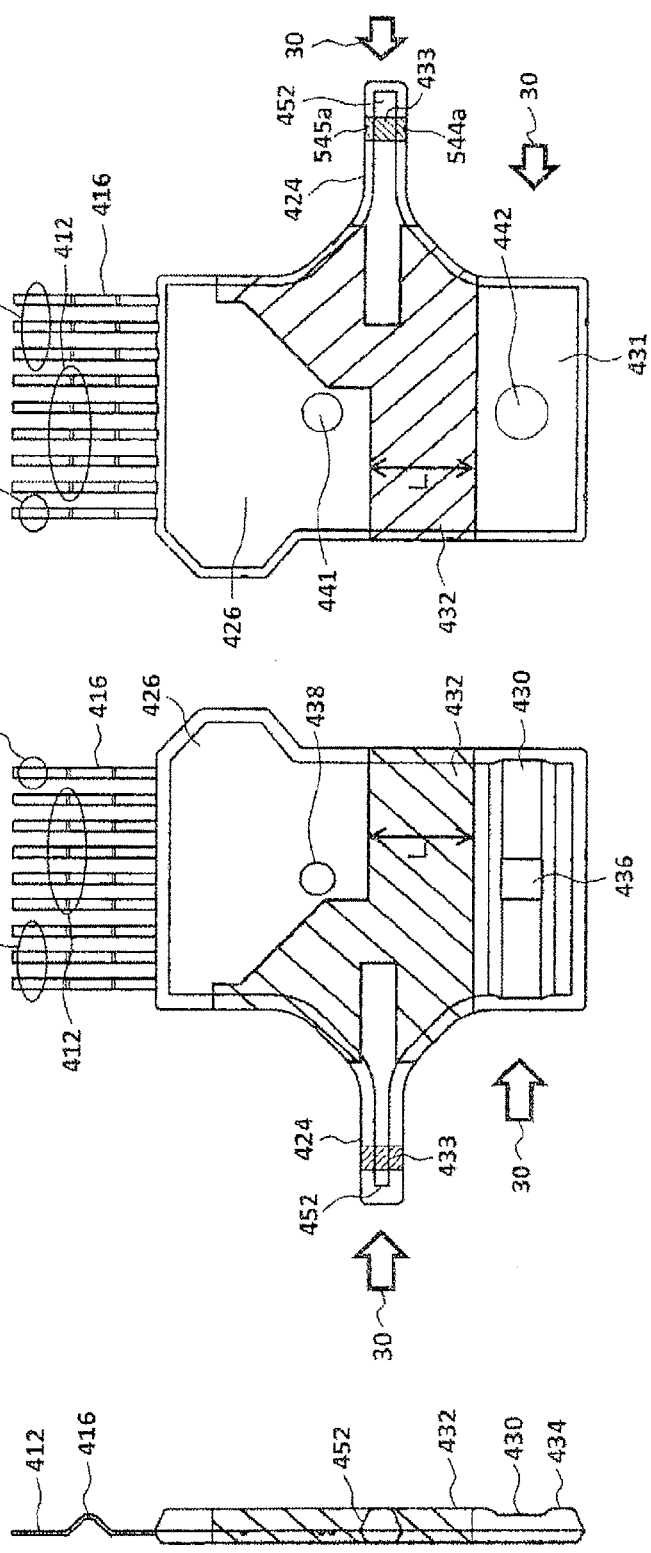

FIGS. 8(A) to 8(C) illustrate an appearance of the circuit package 400 formed through the first resin molding process. It is noted that the hatching portion in the appearance of the circuit package 400 indicates a surface where the circuit package 400 is covered by the resin used in the second resin molding process when the housing 302 is formed through the second resin molding process after the circuit package 400 is manufactured through the first resin molding process. FIG. 8(A) is a left side view illustrating the circuit package 400, FIG. 8(B) is a front view illustrating the circuit package 400, and the FIG. 8(C) is a rear view illustrating the circuit package 400. The circuit package 400 is embedded with the air flow sensing portion 602 or the processing unit 604 described below, and they are integratedly molded using a thermosetting resin.

The circuit package 400 has a package body 426 (see, FIGS. 5(A) to 6(B)) fixed to a housing 302 and a protrusion 424 protruding from the package body 426 and exposed from the housing 302. The package body 426 has a flat plate shape having a rectangular shape in plan view, and the protrusion 424 is provided at a central portion of an upstream end side portion.

On the surface of the circuit package 400 of FIG. 8(B), the measurement surface 430 serving as a plane for flowing the measurement target gas 30 is formed in a shape extending in a flow direction of the measurement target gas 30. In this embodiment, the measurement surface 430 has a rectangular shape extending in the flow direction of the measurement target gas 30. The measurement surface 430 is formed to be thinner than other portions as illustrated in FIG. 8(A), and a part thereof is provided with the heat transfer surface exposing portion 436. The embedded air flow sensing portion 602 performs heat transfer to the measurement target gas 30 through the heat transfer surface exposing portion 436 to measure a condition of the measurement target gas 30 such as a flow velocity of the measurement target gas 30 and output an electric signal representing the flow rate of the main passage 124.

In order to measure a condition of the measurement target gas 30 with high accuracy using the embedded air flow sensing portion 602 (refer to FIG. 16), the gas flowing through the vicinity of the heat transfer surface exposing portion 436 preferably makes a laminar flow having a little vortex. For this reason, it is preferable that there be no height difference between the flow path side surface of the heat transfer surface exposing portion 436 and the plane of the measurement surface 430 that guides the gas. In this configuration, it is possible to suppress an irregular stress or a distortion from being applied to the air flow sensing portion 602 while maintaining high flow rate measurement accuracy. It is noted that the aforementioned height difference may be provided if it does not affect the flow rate measurement accuracy.

On the rear surface of the measurement surface 430 of the heat transfer surface exposing portion 436, a press imprint 442 of the die that supports an internal substrate or plate during the resin molding of the circuit package 400 remains as illustrated in FIG. 8(C). The heat transfer surface exposing portion 436 is used to perform heat exchange with the measurement target gas 30. In order to accurately measure a condition of the measurement target gas 30, it is preferable to appropriately perform heat transfer between the air flow sensing portion 602 and the measurement target gas 30. For this reason, it is necessary to avoid a part of the heat transfer surface exposing portion 436 from being covered by the resin in the first resin molding process. Dies are installed in both the heat transfer surface exposing portion 436 and the backside of measurement surface 431 as a rear surface thereof, and an inflow of the resin to the heat transfer surface exposing portion 436 is prevented using this die. A press imprint 442 having a concave shape is formed on the rear surface of the heat transfer surface exposing portion 436. In this portion, it is preferable to arrange a device serving as the air flow sensing portion 602 or the like in the vicinity to discharge the heat generated from the device to the outside as much as possible. The formed concave portion is less influenced by the resin and easily discharges heat.

A semiconductor diaphragm corresponding to the heat transfer surface exposing portion 436 is formed in an air flow sensing portion (air flow sensing element) 602 including a semiconductor device. The semiconductor diaphragm can be obtained by forming a gap on the rear surface of the flow rate sensing portion 602. If the gap is covered, the semiconductor diaphragm is deformed, and the measurement accuracy is degraded due to a change of the pressure inside the gap caused by a change of the temperature. For this reason, in this embodiment, an opening 438 communicating with the gap of the rear surface of the semiconductor diaphragm is provided on the front surface of the circuit package 400, and a link channel for linking the gap of the rear surface of the semiconductor diaphragm and the opening 438 is provided inside the circuit package 400. It is noted that the opening 438 is provided in the portion not hatched in FIGS. 8(A) to 8(C) in order to prevent the opening 438 from being covered by the resin through the second resin molding process.

It is necessary to form the opening 438 through the first resin molding process while an inflow of the resin to the portion of the opening 438 is suppressed by matching dies to both a portion of the opening 438 and a rear surface thereof and pressing the dies. Formation of the opening 438 and the link channel that connects the gap on the rear surface of the semiconductor diaphragm and the opening 438 will be described below.

4.2 Formation of Temperature Detecting Portion 452 and Protrusion 424 and Effects Thereof The temperature detecting portion 452 provided in the circuit package 400 is provided in the leading end of the protrusion 424 extending in the upstream direction of the measurement target gas 30 in order to support the temperature detecting portion 452 and also has a function of detecting a temperature of the measurement target gas 30. In order to detect a temperature of the measurement target gas 30 with high accuracy, it is preferable to reduce heat transfer to portions other than the measurement target gas 30 as much as possible. The protrusion 424 that supports the temperature detecting portion 452 has a shape having a leading end thinner than the base thereof and is provided with the temperature detecting portion 452 in its leading end portion. Because of such a shape, it is possible to reduce influence of the heat from the neck portion of the protrusion 424 to the temperature detecting portion 452.

After the temperature of the measurement target gas 30 is detected using the temperature detecting portion 452, the measurement target gas 30 flows along the protrusion 424 to approximate the temperature of the protrusion 424 to the temperature of the measurement target gas 30. As a result, it is possible to suppress influence of the temperature of the neck portion of the protrusion 424 to the temperature detecting portion 452. In particular, in this embodiment, the temperature detecting portion 452 is thinner in the vicinity of the protrusion 424 having the temperature detecting portion 452 and is thickened toward the neck of the protrusion. For this reason, the measurement target gas 30 flows along the shape of the protrusion 424 to efficiently cool the protrusion 424.

The hatching portion marked with diagonal lines in FIGS. 8(A) to 8(C) of the neck portion of the protrusion 424 is a fixation surface 432 covered by the resin used to form the housing 302 in the second resin molding process. A hollow is provided in the hatching portion of the neck portion of the protrusion 424. This shows that a portion of the hollow shape not covered by the resin of the housing 302 is provided. If such a portion having a hollow shape not covered by the resin of the housing 302 in the neck portion of the protrusion 424 is provided in this manner, it is possible to further easily cool the protrusion 424 using the measurement target gas 30.

4.3 Terminal of Circuit Package 400

The circuit package 400 is provided with the connection terminal 412 in order to supply electric power for operating the embedded air flow sensing portion 602 or the processing unit 604 and output the flow rate measurement value or the temperature measurement value. In addition, a terminal 414 is provided in order to inspect whether or not the circuit package 400 is appropriately operated, or whether or not an abnormality is generated in a circuit component or connection thereof. In this embodiment, the circuit package 400 is formed by performing transfer molding for the air flow sensing portion 602 or the processing unit 604 using a thermosetting resin through the first resin molding process. By performing the transfer molding, it is possible to improve dimensional accuracy of the circuit package 400. However, in the transfer molding process, since a high pressure resin is pressed into the inside of the sealed die where the air flow sensing portion 602 or the processing unit 604 is embedded, it is preferable to inspect whether or not there is a defect in the air flow sensing portion 602 or the processing unit 604 and such a wiring relationship for the obtained circuit package 400. In this embodiment, an inspection terminal 414 is provided, and inspection is performed for each of the produced circuit packages 400. Since the inspection terminal 414 is not used for measurement, the terminal 414 is not connected to the inner socket of external terminal 361 as described above. In addition, each connection terminal 412 is provided with a curved portion 416 in order to increase a mechanical elastic force. If a mechanical elastic force is provided in each connection terminal 412, it is possible to absorb a stress caused by a difference of the thermal expansion coefficient between the resin of the first resin molding process and the resin of the second resin molding process. That is, each connection terminal 412 is influenced by thermal expansion caused by the first resin molding process, and the inner socket of external terminal 361 connected to each connection terminal 412 are influenced by the resin of the second resin molding process. Therefore, it is possible to absorb generation of a stress caused by the difference of the resin.

4.4 Fixation of Circuit Package 400 Through Second Resin Molding Process and Effects Thereof In FIGS. 8(A) to 8(C), the hatching portion indicates a fixation surface 432 for covering the circuit package 400 using the thermoplastic resin used in the second resin molding process to fix the circuit package 400 to the housing 302 in the second resin molding process. As described above in relation to FIGS. 5(A) to 5(D) or FIGS. 6(A) and 6(B), it is important to maintain high accuracy to provide a specific relationship between the measurement surface 430, the heat transfer surface exposing portion 436 provided in the measurement surface 430, and the shape of the bypass passage. In the second resin molding process, the bypass passage is formed, and the circuit package 400 is fixed to the housing 302 that forms the bypass passage. Therefore, it is possible to maintain a relationship between the bypass passage, the measurement surface 430, and the heat transfer surface exposing portion 436 with significantly high accuracy. That is, since the circuit package 400 is fixed to the housing 302 in the second resin molding process, it is possible to position and fix the circuit package 400 into the die used to form the housing 302 having the bypass passage with high accuracy. By injecting a thermoplastic resin having a high temperature into this die, the bypass passage is formed with high accuracy, and the circuit package 400 is fixed with high accuracy.

In this embodiment, the entire surface of the circuit package 400 is not a fixation surface 432 covered by the resin used to form the housing 302, but the front surface is exposed to the connection terminal 412 side of the circuit package 400. That is, a portion not covered by the resin used to form the housing 302 is provided. In the embodiment illustrated in FIGS. 8(A) to 8(C), out of the front surface of the circuit package 400, the area that is not enveloped by the resin used to form the housing 302 but is exposed from the resin used to form the housing 302 is larger than the area of the fixation surface 432 enveloped by the resin used to form the housing 302.

A thermal expansion coefficient is different between the thermosetting resin used to form the circuit package 400 and the thermoplastic resin used to form the housing 302 having the fixing portion 372. It is preferable to prevent a stress caused by this difference of the thermal expansion coefficient from being applied to the circuit package 400 as long as possible. By reducing the front surface of the circuit package 400 and the fixation surface 432, it is possible to reduce influence based on the difference of the thermal expansion coefficient. For example, it is possible to reduce the fixation surface 432 on the front surface of the circuit package 400 by providing a band shape having a width L.

It is possible to increase a mechanical strength of the protrusion 424 by providing the fixation surface 432 in the base of the protrusion 424. It is possible to more robustly fix the circuit package 400 and the housing 302 to each other by providing, on the front surface of the circuit package 400, a band-shaped fixation surface along a flow axis of the measurement target gas 30 and a fixation surface across the flow axis of the measurement target gas 30. On the fixation surface 432, a portion surrounding the circuit package 400 in a band shape having a width L along the measurement surface 430 is the fixation surface along the flow axis of the measurement target gas 30 described above, and a portion that covers the base of the protrusion 424 is the fixation surface across the flow axis of the measurement target gas 30.

Figure 9:
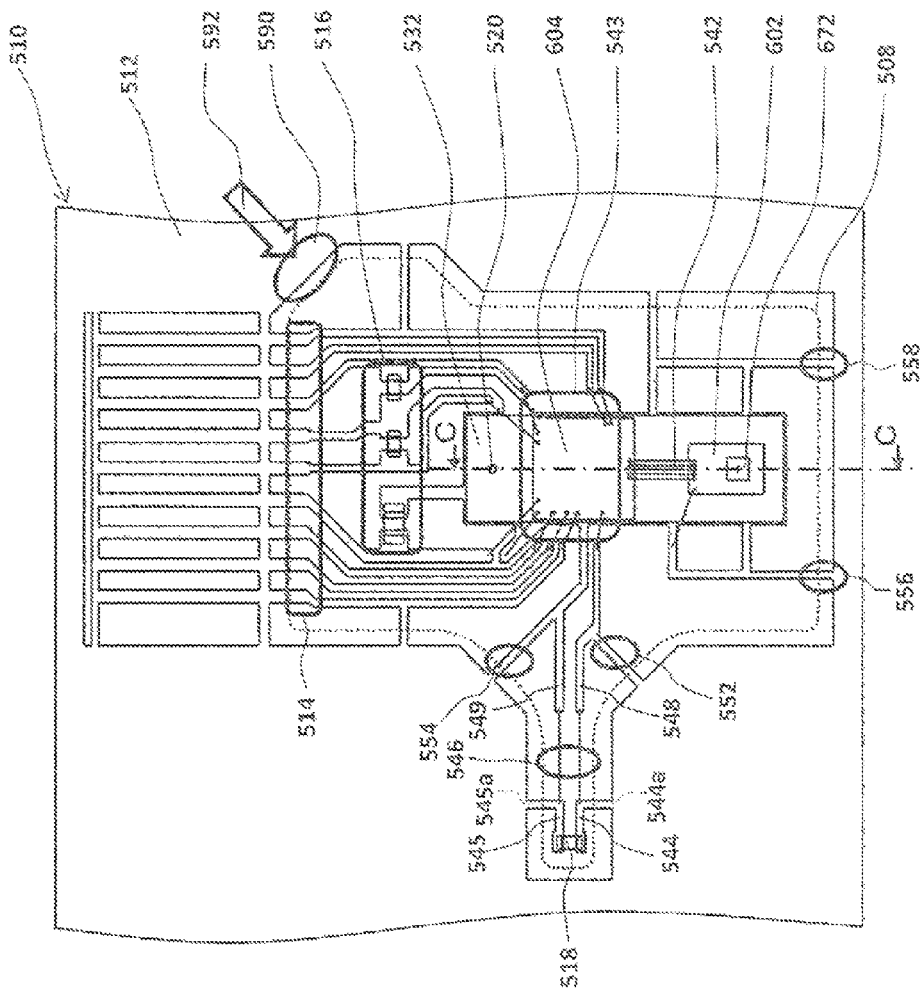
FIG. 9 is a diagram illustrating a state that a circuit component is mounted on a lead of the circuit package.

5. Mounting of Circuit Components to Circuit Package 5.1 Lead Frame of Circuit Package FIG. 9 illustrates a lead frame 510 of the circuit package 400 and a mounting state of a circuit chip and a sensor chip mounted on the lead frame 510. It is noted that a dotted line 508 indicates a portion covered by the die used to mold the circuit package 400.

The lead frame 510 is configured so that a lead is connected mechanically to and supported by a support frame 512, and a plate 532 is mounted in the center of the lead. A chip-like air flow sensing portion (sensor chip) 602 and a processing unit 604 formed as LSI are mounted on the plate 532. A diaphragm 672 is provided in the air flow sensing portion 602, and this corresponds to the above-described heat transfer surface exposing portion 436 formed through molding as described above. Each terminal of the air flow sensing portion 602 described below and the processing unit 604 are electrically connected using a wire 542. Moreover, each terminal of the processing unit 604 and a corresponding lead 514 are connected using a wire 543. In addition, the lead 514 positioned between a portion corresponding to the connection terminal of the circuit package 400 and the plate 532 is connected to the chip-like circuit component (circuit chip) 516 therebetween.

The air flow sensing portion 602 having the diaphragm 672 is arranged in the most leading end side when the circuit package 400 is obtained in this manner. The processing unit 604 is arranged in the side corresponding to the connection terminal for the air flow sensing portion 602 in an LSI state. In addition, a connection wire 543 is arranged in the terminal side of the processing unit 604. By sequentially arranging the air flow sensing portion 602, the processing unit 604, the wire 543, the circuit component 516, and the connection lead 514 in this order from the leading end side of the circuit package 400 to the connection terminal, the entire circuit package 400 becomes simple and concise.

A lead is provided to support the plate 532, and this lead is fixed to the support frame 512 using the lead 556 or 558. It is noted that a lead surface (not shown) having an area similar to that of the plate 532 connected to the lead is provided on the lower surface of the plate 532, and the plate 532 is mounted on the lead surface. This lead surface is grounded. As a result, it is possible to suppress noise by commonly grounding the circuit of the air flow sensing portion 602 or the processing unit 604 using the lead surface, so that measurement accuracy of the measurement target gas 30 is improved. In addition, leads 544 and 545 are provided in the upstream side of the flow path from the plate 532, that is, so as to protrude along an axis directed across the axis of the air flow sensing portion 602, the processing unit 604, or the circuit component 516 described above. A temperature detection element 518, for example, a chip-like thermistor is connected to the leads 544 and 545. In addition, leads 548 and 549 are provided in the vicinity of the processing unit 604 which is a base of the protrusion 424 (namely, on the base end side of the protrusion 424), and the leads 544 and 545 and the leads 548 and 549 are electrically connected using a thin line 546 such as an Au wire. As the leads 548 and 549 and the leads 544 and 545 are directly connected, the heat is transferred to the temperature detection element 518 through the leads 548 and 549 and the leads 544 and 545, so that it may be difficult to accurately measure a temperature of the measurement target gas 30. For this reason, by connecting a wire having a small cross-sectional area and a large thermal resistance, it is possible to increase a thermal resistance between the leads 548 and 549 and the leads 544 and 545. As a result, it is possible to improve temperature measurement accuracy of the measurement target gas 30 so as to prevent influence of the heat from reaching the temperature detection element 518.

The leads 548 and 549 are fixed to the support frame 512 respectively through the lead 552 and 554. A connection portion between the lead 552 or 554 and the support frame 512 is fixed to the support frame 512 while it is inclined against the protruding direction of the protruding temperature detection element 518, and the die is also inclined in this area. As the molding resin flows along in this inclination in the first resin molding process, the molding resin of the first resin molding process smoothly flows to the leading end portion where the temperature detection element 518 is provided, so that reliability is improved.

In FIG. 9, an arrow 592 indicates a resin injection direction. The lead frame 510 where a circuit component is mounted is covered by the die, and a pressed fitting hole 590 for resin injection to the die is provided in a circled position, so that a thermosetting resin is injected into the die along the direction of the arrow 592. The circuit component 516 or the temperature detection element 518 and the leads 544 and 545 for holding the temperature detection element 518 are provided along the direction of the arrow 592 from the pressed fitting hole 590. In addition, the plate 532, the processing unit 604, and the air flow sensing portion 602 are arranged in a direction close to the arrow 592. In this arrangement, the resin smoothly flows in the first resin molding process. In the first resin molding process, a thermosetting resin is used, so that it is important to widen the resin before solidification. For this reason, arrangement of a circuit component of the lead 514 or a wire and a relationship between the pressed fitting hole 590 and the injection direction become very important.

5.2 Structure for Connecting Gap on Rear Surface of Diaphragm and Opening

FIG. 10 is a diagram illustrating a part of the cross section taken along a line C-C of FIG. 9 for describing a communication hole 676 that connects a gap 674 provided inside the diaphragm 672 and the air flow sensing portion (flow rate detecting element) 602 and the hole 520.

The air flow sensing portion 602 for measuring the flow rate of the measurement target gas 30 is provided with a diaphragm 672, and a gap 674 is provided on the rear surface of the diaphragm 672. Although not illustrated, the diaphragm 672 is provided with an element for exchanging heat with the measurement target gas 30 and measuring the flow rate thereby. If the heat is transferred to the elements formed in the diaphragm 672 through the diaphragm 672 separately from the heat exchange with the measurement target gas 30, it is difficult to accurately measure the flow rate. For this reason, it is necessary to increase a thermal resistance of the diaphragm 672 and form the diaphragm 672 as thin as possible.

The air flow sensing portion (air flow sensing element) 602 is buried and fixed into the first resin of the circuit package 400 formed through the first resin molding process such that the heat transfer surface 437 of the diaphragm 672 is exposed. The surface of the diaphragm 672 is provided with the elements (not illustrated) described above (such as a heat generator 608, resistors 652 and 654 as an upstream resistance temperature detector, and resistors 656 and 658 as a downstream resistance temperature detector illustrated in FIG. 17). The elements perform heat transfer with the measurement target gas 30 (not illustrated) through the heat transfer surface 437 on the surface of the elements in the heat transfer surface exposing portion 436 corresponding to the diaphragm 672. The heat transfer surface 437 may be provided on the surface of each element or may be provided with a thin protection film thereon. It is preferable that heat transfer between the elements and the measurement target gas 30 be smoothly performed, and direct heat transfers between the elements should be reduced as much as possible.

A portion of the air flow sensing portion (air flow sensing element) 602 where the elements are provided is arranged in the heat transfer surface exposing portion 436 of the measurement surface 430, and the heat transfer surface 437 is exposed from the resin used to form the measurement surface 430. The outer circumference of the air flow sensing portion 602 is covered by the thermosetting resin used in the first resin molding process for forming the measurement surface 430. If only the side face of the air flow sensing portion 602 is covered by the thermosetting resin, and the surface side of the outer circumference of the air flow sensing portion 602 (that is, the area around the diaphragm 672) is not covered by the thermosetting resin, a stress generated in the resin used to form the measurement surface 430 is received only by the side face of the air flow sensing portion 602, so that a distortion may generated in the diaphragm 672, and characteristics may be deteriorated. The distortion of the diaphragm 672 is reduced by covering the outer circumference portion of the air flow sensing portion 602 with the thermosetting resin as illustrated in FIG. 10. Meanwhile, if a height difference between the heat transfer surface 437 and the measurement surface 430 where the measurement target gas 30 flows is large, the flow of the measurement target gas 30 is disturbed, so that measurement accuracy is degraded. Therefore, it is preferable that a height difference W between the heat transfer surface 437 and the measurement surface 430 where the measurement target gas 30 flows be small.

The diaphragm 672 is formed thin in order to suppress heat transfer between each element, and the thin is obtained by forming a gap 674 in the rear surface of the air flow sensing portion 602. If this gap 674 is sealed, a pressure of the gap 674 formed on the rear surface of the diaphragm 672 changes depending on a temperature change. As a pressure difference between the gap 674 and the surface of the diaphragm 672 increases, the diaphragm 672 receives the pressure, and a distortion is generated, so that high accuracy measurement becomes difficult. For this reason, a hole 520 connected to the opening 438 opened to the outside is provided in the plate 532, and a communication hole 676 that connects this hole 520 and the gap 674 is provided. This communication hole 676 consists of, for example, a pair of plates including first and second plates 532 and 536. A first plate 532 is provided with holes 520 and 521 and a trench for forming the communication hole 676. The communication hole 676 is formed by covering the trench and the holes 520 and 521 with the second plate 536. Using the communication hole 676 and the hole 520, the pressures applied to the front and rear surfaces of the diaphragm 672 becomes approximately equal, so that the measurement accuracy is improved.

As described above, the communication hole 676 can be formed by covering the trench and the holes 520 and 521 with the second plate 536. Alternatively, the lead frame may be used as second plate 536. As described in relation to FIG. 9, the diaphragm 672 and the LSI circuit serving as the processing unit 604 are provided on the plate 532. A lead frame for supporting the plate 532 where the diaphragm 672 and the processing unit 604 are mounted is provided thereunder. Therefore, using the lead frame, the structure becomes simpler. In addition, the lead frame may be used as a ground electrode. If the lead frame serves as the second plate 536, and the communication hole 676 is formed by covering the holes 520 and 521 formed in the first plate 532 using the lead frame and covering the trench formed in the first plate 532 using the lead frame in this manner, it is possible to simplify the entire structure. In addition, it is possible to reduce influence of noise from the outside of the diaphragm 672 and the processing unit 604 because the lead frame serves as a ground electrode.

In the circuit package 400, the press imprint 442 remains on the rear surface of the circuit package 400 where the heat transfer surface exposing portion 436 is formed. In the first resin molding process, in order to prevent an inflow of the resin to the heat transfer surface exposing portion 436, a die such as an insertion die is installed in a portion of the heat transfer surface exposing portion 436, and a die is installed in a portion of the press imprint 442 opposite thereto, so that an inflow of the resin to the heat transfer surface exposing portion 436 is suppressed. By forming a portion of the heat transfer surface exposing portion 436 in this manner, it is possible to measure the flow rate of the measurement target gas 30 with significantly high accuracy.

FIG. 11 illustrates a state that the lead frame 510 of FIG. 9 is molded with a thermosetting resin through the first resin molding process and is covered by the thermosetting resin. Through this molding, the measurement surface 430 is formed on the front surface of the circuit package 400, and the heat transfer surface exposing portion 436 is provided on the measurement surface 430. In addition, the gap 674 on the rear surface of the diaphragm 672 corresponding to the heat transfer surface exposing portion 436 is connected to the opening 438. The temperature detecting portion 452 for measuring a temperature of the measurement target gas 30 is provided in the leading end of the protrusion 424, and the temperature detection element 518 (refer to FIG. 9) is embedded inside. Inside the protrusion 424, in order to suppress heat transfer, a lead for extracting the electric signal of the temperature detection element 518 is segmented, and a connection line 546 having a large thermal resistance is arranged. As a result, it is possible to suppress heat transfer from the base of the protrusion 424 to the temperature detecting portion 452 and influence from the heat.

A slope portion 594 or 596 is formed in the base of the protrusion 424. A flow of the resin in the first resin molding process becomes smooth. In addition, the measurement target gas 30 measured by the temperature detecting portion 452 smoothly flows from the protrusion 424 to its base using the slope portion 594 or 596 while the temperature detecting portion 452 is installed and operated in a vehicle, so as to cool the base of the protrusion 424. Therefore, it is possible to reduce influence of the heat to the temperature detecting portion 452. After the state of FIG. 11, the lead 514 is separated from each terminal so as to be the connection terminal 412 or the terminal 414.

In the first resin molding process, it is necessary to prevent an inflow of the resin to the heat transfer surface exposing portion 436 or the opening 438. For this reason, in the first resin molding process, an inflow of the resin is suppressed in a position of the heat transfer surface exposing portion 436 or the opening 438. For example, an insertion die larger than the diaphragm 672 is installed, and a press is installed in the rear surface thereof, so that it is pressed from both surfaces. In FIG. 8(C), the press imprint 442 or 441 remains on the rear surface corresponding to the heat transfer surface exposing portion 436 or the opening 438 of FIG. 11 or the heat transfer surface exposing portion 436 or the opening 438 of FIG. 8(B).

When a cut end portion of a lead is exposed from a resin surface of the circuit package 400 by cutting off the support frame 512 in FIG. 11, if water or salt water (hereinafter referred to as water or the like) is adhered to the cut end portion of the lead, corrosion may occur. In addition, water or the like intrudes into the circuit package 400 from the cut end portion of the lead during use and may erode a circuit chip and a sensor chip. It is important to prevent such a problem from the viewpoint of durability or reliability. For example, the slope portions 594 and 596 are covered with a mold resin (second mold resin) in a second resin molding process, and a cut end portion formed by cutting between the leads 552 and 554 and the support flame 512 shown in FIG. 9 is covered with the mold resin (see, FIGS. 8(B) and 8(C)). According to this constitution, it is possible to prevent erosion of the cut end portion of the lead 552 or 554 or intrusion of water or the like into the circuit package 400 from the cut end portion. The cut end portion of the lead 552 or 554 adjoins an important lead portion that transmits the electric signal of the temperature detecting portion 452. Accordingly, it is preferable that the cut end portion of the lead is covered in the second resin molding process.

The leads 544 and 545 on which the temperature detection element 518 is mounted are arranged in a paired manner and have a large potential difference therebetween, a cut end portion (first cut end portion) 544a is disposed to be exposed on a side surface on one side in a width direction perpendicular to the protruding direction of the protrusion 424, and a cut end portion (second cut end portion) 545a is disposed to be exposed on a side surface on the other side in the width direction of the protrusion 424 facing the cut end portion 544a. The cut end portions 544a and 545a are exposed at a position on the base end side of the protrusion 424 relative to the temperature detection element 518 of the temperature detecting portion 452 and a position extremely adjoining to each other. As a result, for example when water or the like flowing into a main passage while mixing with a measurement target gas is adhered between the cut end portions 544a and 545a of the protrusion 424, this causes short-circuiting, so that the leads 544 and 545 may erode. Accordingly, it is preferable that the cut end portions 544a and 545a are covered with resin or the like.

As shown in FIGS. 5(B) and 6(B), the protrusion 424 of the circuit package 400 is provided with a covering portion 371 covered with the mold resin (second mold resin) in the second resin molding process. FIGS. 12(A) and 12(B) are diagrams for explaining a specific example of a constitution in which the protrusion 424 is covered by the covering portion 371, in which FIG. 12(A) is an enlarged view of the relevant portion of FIG. 5(A), and FIG. 12(B) is an enlarged view of the relevant portion of FIG. 5(B).

As shown in FIGS. 12(A) and 12(B), the covering portion 371 has a ring shape fitted to the outside of the protrusion 424 and adhered to the protrusion 424. In FIGS. 8(B) and 8(C), a covered surface covered by the covering portion 371 is shown by a hatched area 433. As shown in FIGS. 8(B) and 8(C), the covering portion 371 covers the cut end portions 544a and 545a of the lead 544. Accordingly, it is possible to prevent adhesion of water or the like to the cut end portions 544a and 545a, erosion due to short-circuiting, and intrusion of water or the like into the circuit package 400.

In the above specific example, although the case where the covering portion 371 has a ring shape has been described as an example, any covering portion may be used as long as it can cover the cut end portions 544a and 545a of the leads 544 and 545. For example, the cut end portions 544a and 545a may be covered by coating an adhesive such as epoxy or silicon. Alternatively, as shown in FIGS. 13(A) and 13(B), for example, the cut end portions 544a and 545a may be covered by providing a C-shaped covering portion 375. The covering portion 375 is formed of a mold resin along with the housing 302 in the second resin molding process and coupled integrally to the housing 302 by a coupling portion 374. Compared to the ring-shaped covering portion 371, the C-shaped covering portion 375 can reduce the heat capacity, and the responsiveness of the temperature detection element 518 can be improved.

The protrusion 424 and the covering portion 371 are fixed to each other by fixing means. For example, as shown in FIG. 12(B), in a portion covered by the covering portion 371 of the protrusion 424, two recessed grooves (concave portions) 424a are recessed along the width direction of the protrusion 424. Then, a mold resin is molded to the portion in the second resin molding process to cover the covering portion 371, whereby in the covering portion 371, a projecting strip (convex portion) fitted into the recessed groove 424a is formed. Accordingly, the position of the covering portion 371 with respect to the protrusion 424 can be fixed, so that it is possible to prevent the position of the covering portion 371 from being deviated by movement of the covering portion 371 in the axial direction of the protrusion 424 and prevent the covering portion 371 from dropping off from the protrusion 424.

Figure 5C:
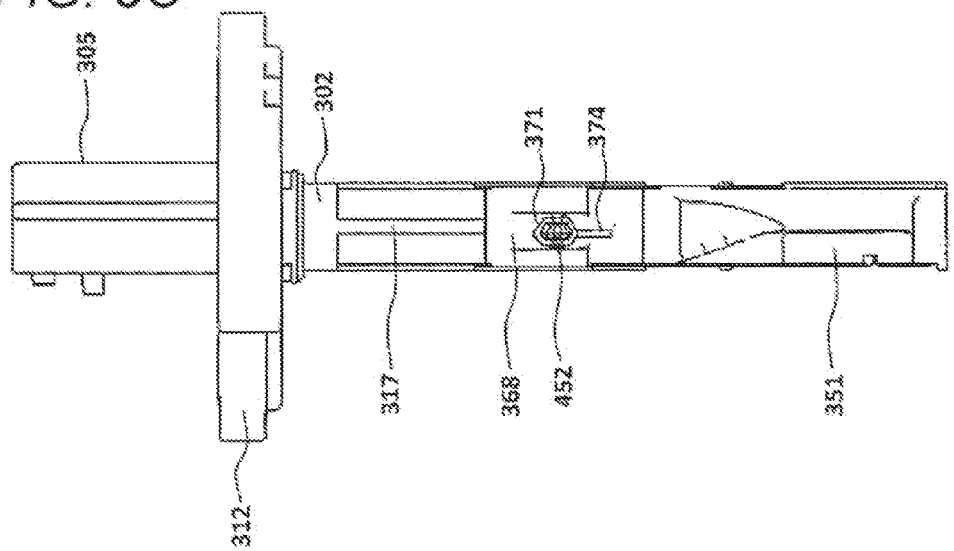
FIG. 5C is a left side view illustrating another specific example of the housing of the thermal flow meter.
Figure 5D:
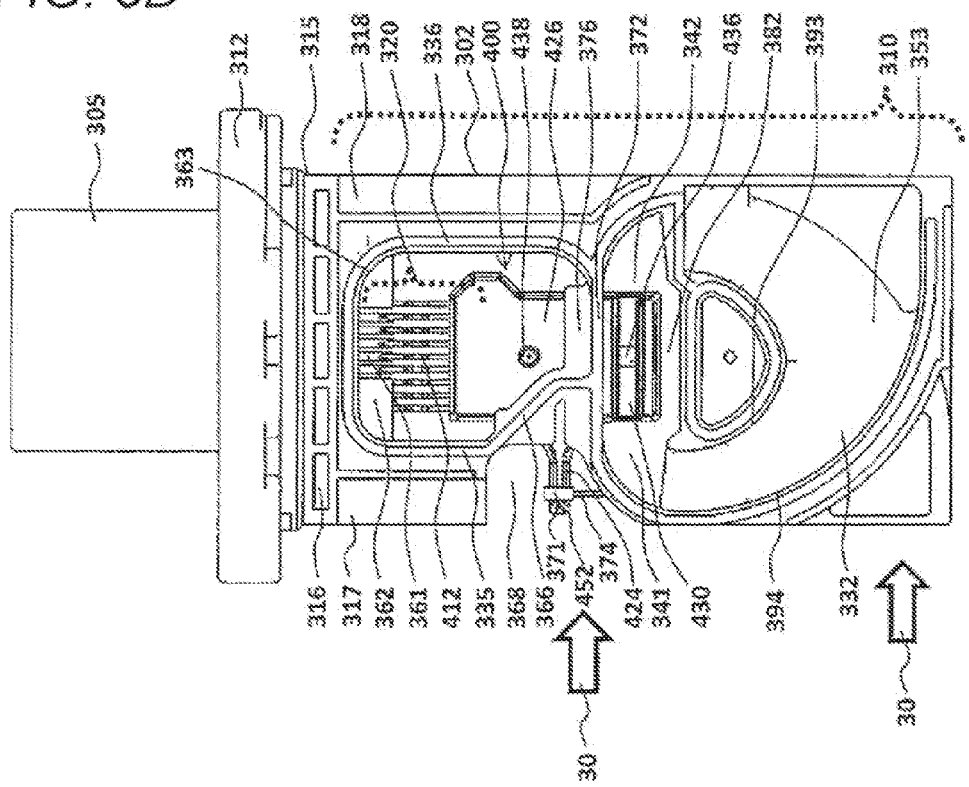
FIG. 5D is a front view illustrating another specific example of the housing of the thermal flow meter.

The fixing means is not limited to the above constitution, and any means is applicable as long as the position of the covering portion 371 with respect to the protrusion 424 can be fixed. Accordingly, the number of the recessed grooves 424a formed in the protrusion 424 may be reduced, the projecting strip may be provided instead of the recessed groove 424a, a projecting shaft may be projectingly provided, or a recessed hole may be formed. As shown in FIGS. 5(C) and 5(D), a coupling portion 374 coupling between the covering portion 371 and the housing 302 may be provided. One end of the coupling portion 374 is fixed to the housing 302, and the other end is fixed to the covering portion 371. The coupling portion 374 can be formed with the second mold resin in the second resin molding process.

Figure 14A:
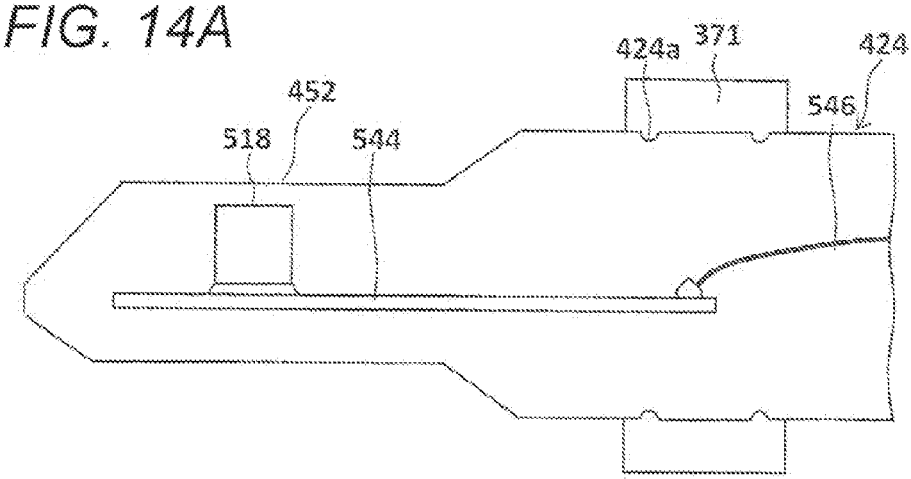
FIG. 14A is a cross-sectional view illustrating another specific example of the protrusion.
Figure 14B:
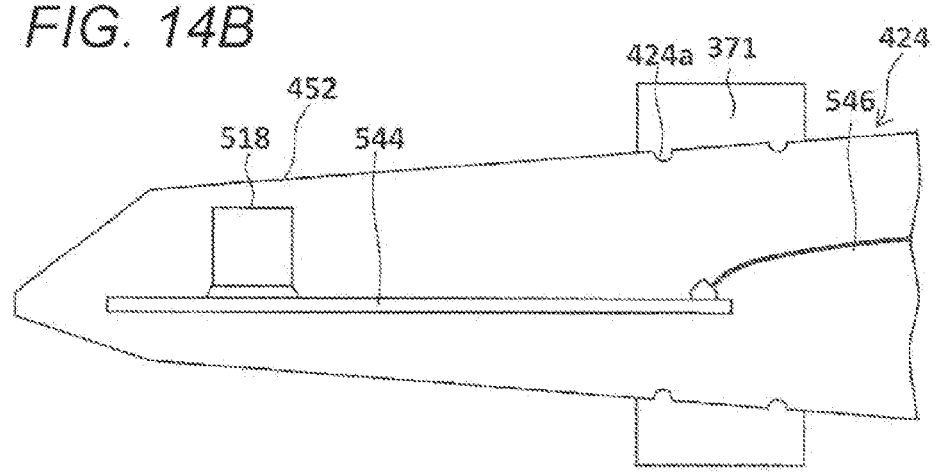
FIG. 14B is a cross-sectional view illustrating another specific example of the protrusion.
Figure 14C:
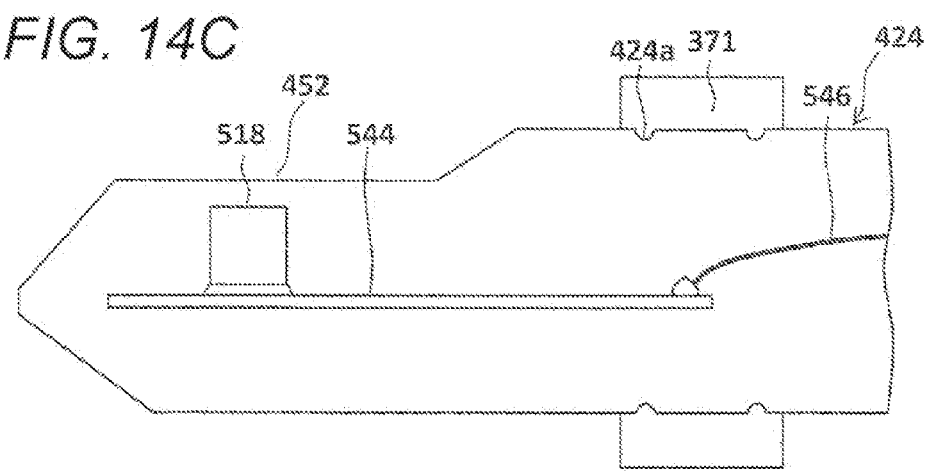
FIG. 14C is a cross-sectional view illustrating another specific example of the protrusion.

The protrusion 424 has the same thickness as that of the package body 426 of the circuit package 400; however, as shown in FIGS. 14A to 14C, the protrusion 424 is configured so that the resin thickness of the mold resin on the tip end side is smaller than that on the base end side, and the thickness of the temperature detecting portion 452 of the protrusion 424 may be smaller than the thickness of the package body 426. FIGS. 14A to 14C are cross-sectional views showing other specific examples of the protrusion 424 and each correspond to the diagram in which a D-D cross section of FIG. 11 is shown from the direction of the arrow.

FIG. 14A shows a structure in which the protrusion 424 is formed into a thin plate shape so that front and back surfaces of the tip end portion of the protrusion 424 each have a step, and the resin thickness of a portion corresponding to the temperature detection element 518 of the temperature detecting portion 452 is smaller than the thickness of the base end portion of the protrusion 424 having the same resin thickness as that of the package body 426.

FIG. 14B shows a structure in which the protrusion 424 is formed into a tapered shape so that the thickness of the protrusion 424 is gradually reduced as it approaches the tip end portion of the protrusion 424. FIG. 14C shows a structure in which the protrusion 424 is formed into a step shape so that only the front surface of the tip end portion of the protrusion 424 has a step, and the height of a portion on the temperature detection element 518 side of the temperature detecting portion 452 is small.

In the respective structures shown in FIGS. 14A to 14C, since the protrusion 424 is formed so that the thickness of the temperature detecting portion 452, and more specifically the resin thickness of a portion facing the temperature detection element 518 is small, the heat capacity around the temperature detection element 518 can be reduced, and high responsiveness can be obtained. In addition, heat transfer from the base end side of the protrusion 424 can be suppressed, and high temperature detection accuracy can be obtained.

Particularly, in the thin plate-shaped structure shown in FIG. 14A, compared to the structures of FIGS. 14B and 14C, the heat capacity around the temperature detection element 518 can be most reduced, and high responsiveness can be obtained. Since the cross-sectionally tapered-shaped structure shown in FIG. 14B has no step, the heat capacity can be reduced without locally reducing the strength of the protrusion 424. Accordingly, it is possible to prevent the protrusion 424 from being broken due to concentration of stress at one point of the protrusion 424, for example. Meanwhile, in the cross-sectionally step-shaped structure shown in FIG. 14C, since the back surface of the tip end portion of the protrusion 424 extends on the same plane as the back surface of the package body 426, higher strength can be obtained than the case of the structure of FIG. 14A.

Since the protrusion 424 has a structure in which the lead 544, disposed on the tip end side of the protrusion 424 and connected to the temperature detection element 518, and the lead 548 disposed on the base end side of the protrusion 424 are connected to each other by the connection line 546, having a smaller diameter than that of the lead 544 or 548, and sealed, the heat transferred from the package body 426 side through the lead is thermally insulated, so that the heat can be prevented from transferring to the temperature detection element 518, whereby high temperature detection accuracy can be obtained.

6. Process of Producing Thermal Flow Meter 300

6.1 Process of Producing Circuit Package 400

FIGS. 15A and 15B illustrate a process of producing the thermal flow meter 300, in which FIG. 15A illustrates a process of producing the circuit package 400, and FIG. 15B illustrates a process of producing a thermal flow meter. In FIG. 15A, step 1 shows a process of producing a lead frame of FIG. 9. This lead frame is formed, for example, through press machining.

In step 2, the plate 532 is first mounted on the lead frame 510 obtained through step 1, and the air flow sensing portion 602 or the processing unit 604 is further mounted on the plate 532. Then, the temperature detection element 518 and the circuit component 516 such as a chip capacitor are mounted. In step 2, electrical wiring is performed between circuit components, between the circuit component and the lead, and between the leads. In step 2, the leads 544 and 545 and the leads 548 and 549 are connected using the connection line 546 for increasing a thermal resistance. In step 2, the circuit component 516 illustrated in FIG. 9 is mounted on the lead, and the electrical wiring is further performed, so that an electric circuit is formed.

Then, in step 3, through the first resin molding process, molding using a thermosetting resin (first mold resin) is performed. This state is illustrated in FIG. 11. In addition, in step 3, the support frame 512 is cut off from the lead frame 510, and the leads are separated from each other, so that the circuit package 400 of FIGS. 8(A) to 8(C) is obtained. In this circuit package 400, as illustrated in FIGS. 8(A) to 8(C), the measurement surface 430 or the heat transfer surface exposing portion 436 is formed.

In step 4, a visual inspection or an operational inspection is performed for the obtained circuit package 400. In the first resin molding process of step 3, the electric circuit obtained in step 2 is fixed to the inside of the die, and a high temperature resin is injected into the die with a high pressure. Therefore, it is preferable to inspect whether or not there is an abnormality in the electric component or the electric wiring. For this inspection, the terminal 414 is used in addition to the connection terminal 412 of FIGS. 8(A) to 8(C). It is noted that, because the terminal 414 is not used thereafter, it may be cut out from the base after this inspection. The terminals 412 and 414 are accommodated in a circuit chamber sealed by the housing 302, the front cover 303, and the rear cover 304, and since there is no possibility that the terminals are in contact with the measurement target gas, the cut end portion is not required to be covered.

6.2 Process of Producing Thermal Flow Meter 300 and Calibration of Characteristics In the process of FIG. 15B, the circuit package 400 produced as illustrated in FIG. 15A and the external terminal 306 are used. In step 5, the housing 302 is formed through the second resin molding process. In this housing 302, a bypass passage trench formed of resin, the flange 312, and the external connector 305 are formed, and hatching portions 432 and 433 of the circuit package 400 illustrated in FIGS. 8(A) to 8(C) are covered with the mold resin in the second resin molding process, so that the circuit package 400 is fixed to the housing 302. By combining the production (step 3) of the circuit package 400 through the first resin molding process and the formation of the housing 302 of the thermal flow meter 300 through the second resin molding process, the air flow sensing accuracy is remarkably improved. Especially, since the cut end portions 544a and 545a of a pair of the leads 544 and 545 exposed at a position where a potential difference is large and the leads are close to each other can be covered by the covering portion 371, these cut end portions 544a and 545a can be prevented from being eroded due to adhesion of water or like, and water or the like can be prevented from intruding into the circuit package 400 from the cut end portions. In step 6, each inner socket of external terminal 361 of FIGS. 13(A) and 13(B) is separated. In step 7, the connection terminal 412 and the inner socket of external terminal 361 are connected.

The housing 302 is obtained in step 7. Then, in step 8, the front and rear covers 303 and 304 are installed in the housing 302, so that the inside of the housing 302 is sealed with the front and rear covers 303 and 304, and the bypass passage for flowing the measurement target gas 30 is obtained. In addition, an orifice structure described in relation to FIG. 7 is formed by the protrusion 356 provided in the front or rear cover 303 or 304. It is noted that the front cover 303 is formed through the molding of step 10, and the rear cover 304 is formed through the molding of step 11. In addition, the front and rear covers 303 and 304 are formed through separate processes using different dies.

In step 9, a characteristic test is performed by guiding the air to the bypass passage in practice. Since a relationship between the bypass passage and the air flow sensing portion is maintained with high accuracy as described above, significantly high measurement accuracy is obtained by performing a characteristic calibration through a characteristic test. In addition, since the molding is performed with a positioning or configuration relationship between the bypass passage and the air flow sensing portion is determined through the first resin molding process and the second resin molding process, the characteristic does not change much even in a long time use, and high reliability is obtained in addition to the high accuracy.

7. Circuit Configuration of Thermal Flow Meter 300

7.1 Entire Circuit Configuration of Thermal Flow Meter 300

Figure 16:
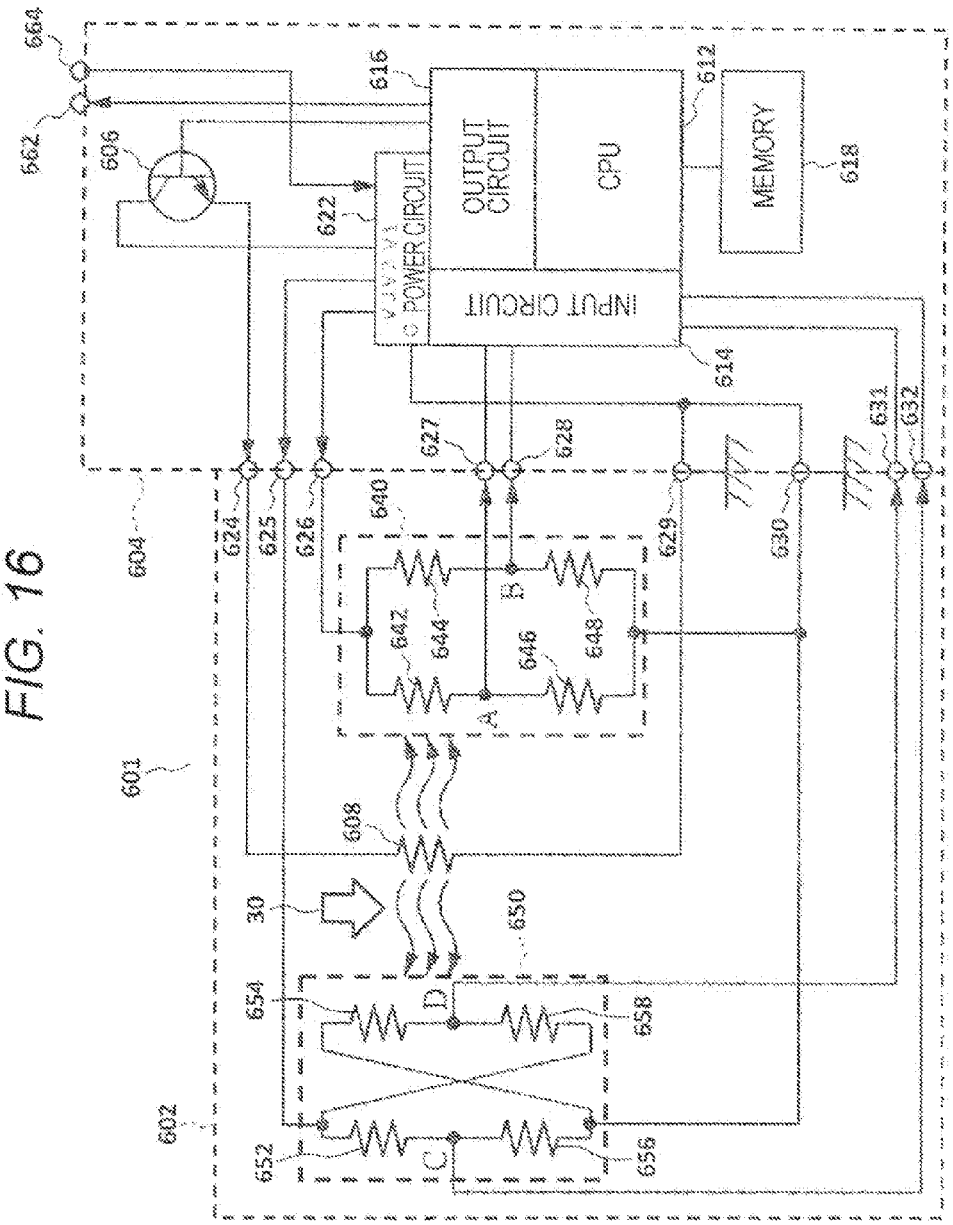
FIG. 16 is a circuit diagram illustrating an air flow sensing circuit of the thermal flow meter.

FIG. 16 is a circuit diagram illustrating the air flow sensing circuit 601 of the thermal flow meter 300. It is noted that the measurement circuit relating to the temperature detecting portion 452 described in the aforementioned embodiment is also provided in the thermal flow meter 300, but is not illustrated intentionally in FIG. 16. The air flow sensing circuit 601 of the thermal flow meter 300 includes the air flow sensing portion 602 having the heat generator 608 and the processing unit 604. The processing unit 604 control a heat amount of the heat generator 608 of the air flow sensing portion 602 and outputs a signal representing the flow rate through the terminal 662 based on the output of the air flow sensing portion 602. For this processing, the processing unit 604 includes a central processing unit (hereinafter, referred to as "CPU") 612, an input circuit 614, an output circuit 616, a memory 618 for storing data representing a relationship between the calibration value or the measurement value and the flow rate, and a power circuit 622 for supplying a certain voltage to each necessary circuit. The power circuit 622 is supplied with DC power from an external power supply such as a vehicle-mount battery through a terminal 664 and a ground terminal (not illustrated).

The air flow sensing portion 602 is provided with a heat generator 608 for heating the measurement target gas 30. A voltage V1 is supplied from the power circuit 622 to a collector of a transistor 606 included in a current supply circuit of the heat generator 608, and a control signal is applied from the CPU 612 to a base of the transistor 606 through the output circuit 616. Based on this control signal, a current is supplied from the transistor 606 to the heat generator 608 through the terminal 624. The current amount supplied to the heat generator 608 is controlled by a control signal applied from the CPU 612 to the transistor 606 of the current supply circuit of the heat generator 608 through the output circuit 616. The processing unit 604 controls the heat amount of the heat generator 608 such that a temperature of the measurement target gas 30 increases by a predetermined temperature, for example, 100° C. from an initial temperature by heating using the heat generator 608.

The air flow sensing portion 602 includes a heating control bridge 640 for controlling a heat amount of the heat generator 608 and a bridge circuit of air flow sensing 650 for measuring a flow rate. A predetermined voltage V3 is supplied to one end of the heating control bridge 640 from the power circuit 622 through the terminal 626, and the other end of the heating control bridge 640 is connected to the ground terminal 630. In addition, a predetermined voltage V2 is applied to one end of the bridge circuit of air flow sensing 650 from the power circuit 622 through the terminal 625, and the other end of the bridge circuit of air flow sensing 650 is connected to the ground terminal 630.

The heating control bridge 640 has a resistor 642 which is a resistance temperature detector having a resistance value changing depending on the temperature of the heated measurement target gas 30, and the resistors 642, 644, 646, and 648 constitute a bridge circuit. A potential difference between a node A between the resistors 642 and 646 and a node B between the resistors 644 and 648 is input to the input circuit 614 through the terminals 627 and 628, and the CPU 612 controls the current supplied from the transistor 606 to control the heat amount of the heat generator 608 such that the potential difference between the nodes A and B is set to a predetermined value, for example, zero voltage in this embodiment. The air flow sensing circuit 601 illustrated in FIG. 16 heats the measurement target gas 30 using the heat generator 608 such that a temperature increases by a predetermined temperature, for example, 100° C. from an initial temperature of the measurement target gas 30 at all times. In order to perform this heating control with high accuracy, resistance values of each resistor of the heating control bridge 640 are set such that the potential difference between the nodes A and B becomes zero when the temperature of the measurement target gas 30 heated by the heat generator 608 increases by a predetermined temperature, for example, 100° C. from an initial temperature at all times. Therefore, in the air flow sensing circuit 601 of FIG. 16, the CPU 612 controls the electric current supplied to the heat generator 608 such that the potential difference between the nodes A and B becomes zero.

The bridge circuit of air flow sensing 650 includes four resistance temperature detectors of resistors 652, 654, 656, and 658. The four resistance temperature detectors are arranged along the flow of the measurement target gas 30 such that the resistors 652 and 654 are arranged in the upstream side in the flow path of the measurement target gas 30 with respect to the heat generator 608, and the resistors 656 and 658 are arranged in the downstream side in the flow path of the measurement target gas 30 with respect to the heat generator 608. In addition, in order to increase the measurement accuracy, the resistors 652 and 654 are arranged such that distances to the heat generator 608 are approximately equal, and the resistors 656 and 658 are arranged such that distances to the heat generator 608 are approximately equal.

A potential difference between a node C between the resistors 652 and 656 and a node D between the resistors 654 and 658 is input to the input circuit 614 through the terminals 631 and 632. In order to increase the measurement accuracy, each resistance of the bridge circuit of air flow sensing 650 is set, for example, such that a positional difference between the nodes C and D is set to zero while the flow of the measurement target gas 30 is set to zero. Therefore, while the potential difference between the nodes C and D is set to, for example, zero, the CPU 612 outputs, from the terminal 662, an electric signal indicating that the flow rate of the main passage 124 is zero based on the measurement result that the flow rate of the measurement target gas 30 is zero.

When the measurement target gas 30 flows along the arrow direction in FIG. 16, the resistor 652 or 654 arranged in the upstream side is cooled by the measurement target gas 30, and the resistors 656 and 658 arranged in the downstream side of the measurement target gas 30 are heated by the measurement target gas 30 heated by the heat generator 608, so that the temperature of the resistors 656 and 658 increases. For this reason, a potential difference is generated between the nodes C and D of the bridge circuit of air flow sensing 650, and this potential difference is input to the input circuit 614 through the terminals 631 and 632. The CPU 612 searches data indicating a relationship between the flow rate of the main passage 124 and the aforementioned potential difference stored in the memory 618 based on the potential difference between the nodes C and D of the bridge circuit of air flow sensing 650 to obtain the flow rate of the main passage 124. An electric signal indicating the flow rate of the main passage 124 obtained in this manner is output through the terminal 662. It is noted that, although the terminals 664 and 662 illustrated in FIG. 16 are denoted by new reference numerals, they are included in the connection terminal 412 of FIGS. 5(A) to 5(D) or FIGS. 6(A) and 6(B) described above.

The memory 618 stores the data indicating a relationship between the potential difference between the nodes C and D and the flow rate of the main passage 124 and calibration data for reducing a measurement error such as a variation, obtained based on the actual measurement value of the gas after production of the circuit package 400. It is noted that the actual measurement value of the gas after production of the circuit package 400 and the calibration value based thereon are stored in the memory 618 using the external terminal 306 or the calibration terminal 307 illustrated in FIGS. 4(A) and 4(B). In this embodiment, the circuit package 400 is produced while an arrangement relationship between the bypass passage for flowing the measurement target gas 30 and the measurement surface 430 or an arrangement relationship between the bypass passage for flowing the measurement target gas 30 and the heat transfer surface exposing portion 436 is maintained with high accuracy and a little variation. Therefore, it is possible to obtain a measurement result with remarkably high accuracy through calibration using the calibration value.

7.2 Configuration of Air Flow Sensing Circuit 601

Figure 17:
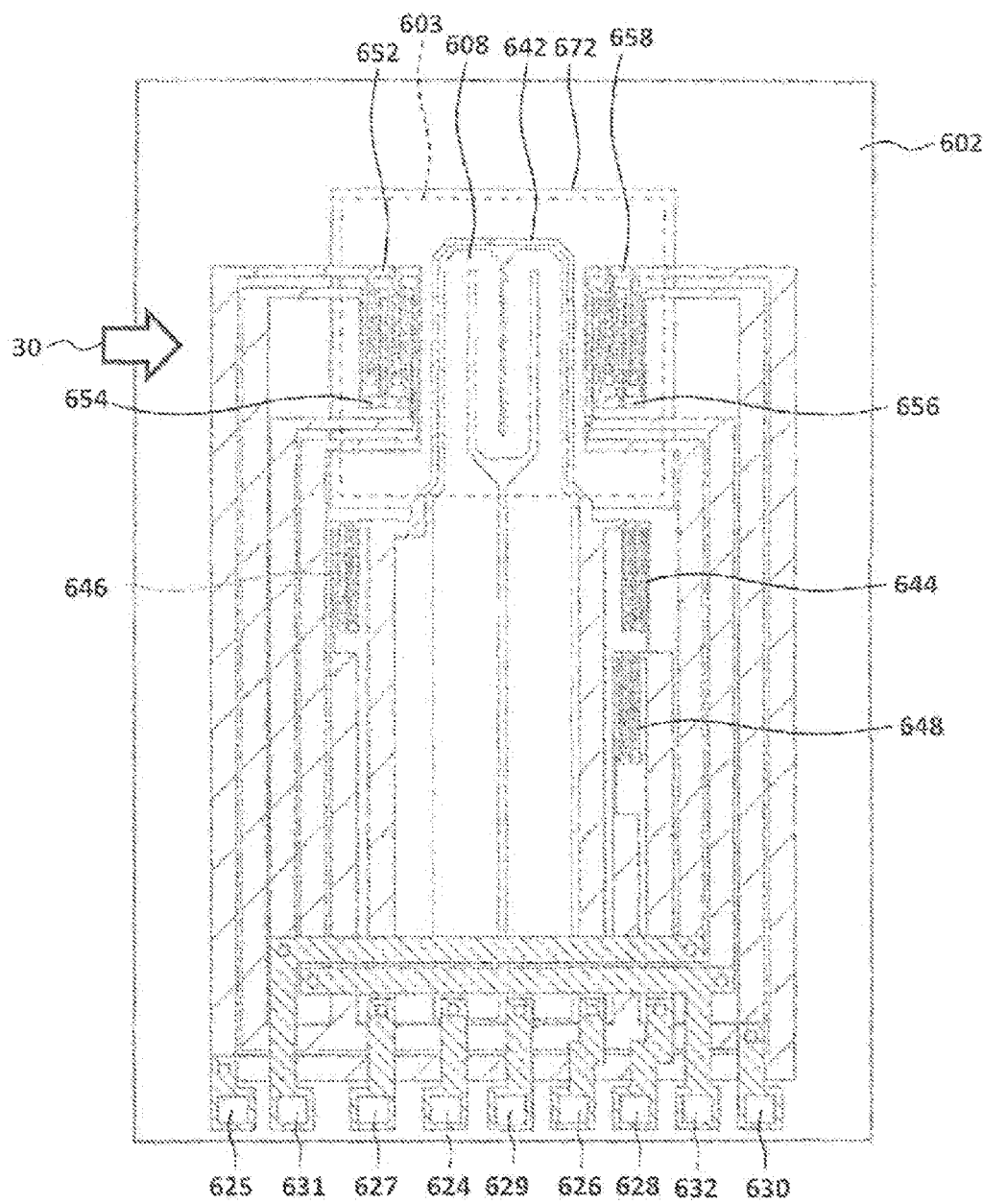
FIG. 17 is an explanatory diagram illustrating an air flow sensing portion of the air flow sensing circuit.

FIG. 17 is a circuit configuration diagram illustrating a circuit arrangement of the air flow sensing circuit 601 of FIG. 16 described above. The air flow sensing circuit 601 is manufactured from a semiconductor chip having a rectangular shape. The measurement target gas 30 flows along the arrow direction from the left side to the right side of the air flow sensing circuit 601 illustrated in FIG. 17.

A diaphragm 672 having a rectangular shape with the thin semiconductor chip is formed in the air flow sensing portion (air flow sensing element) 602 manufactured from a semiconductor chip. The diaphragm 672 is provided with a thin area (that is, the aforementioned heat transfer surface) 603 indicated by the dotted line. The aforementioned gap is formed in the rear surface side of the thin area 603 and communicates with the opening 438 illustrated in FIGS. 8(A) to 8(C) or FIGS. 5(A) to 5(D), so that the gas pressure inside the gap depends on the pressure of the gas guided from the opening 438.

By reducing the thickness of the diaphragm 672, the thermal conductivity is lowered, and heat transfer to the resistors 652, 654, 658, and 656 provided in the thin area (heat transfer surface) 603 of the diaphragm 672 through the diaphragm 672 is suppressed, so that the temperatures of the resistors are approximately set through heat transfer with the measurement target gas 30.

The heat generator 608 is provided in the center of the thin area 603 of the diaphragm 672, and the resistor 642 of the heating control bridge 640 is provided around the heat generator 608. In addition, the resistors 644, 646, and 648 of the heating control bridge 640 are provided in the outer side of the thin area 603. The resistors 642, 644, 646, and 648 formed in this manner constitute the heating control bridge 640.

In addition, the resistors 652 and 654 as upstream resistance temperature detectors and the resistors 656 and 658 as downstream resistance temperature detectors are arranged to interpose the heat generator 608. The resistors 652 and 654 as upstream resistance temperature detectors are arranged in the upstream side in the arrow direction where the measurement target gas 30 flows with respect to the heat generator 608. The resistors 656 and 658 as downstream resistance temperature detectors are arranged in the downstream side in the arrow direction where the measurement target gas 30 flows with respect to the heat generator 608. In this manner, the bridge circuit of air flow sensing 650 is formed by the resistors 652, 654, 656, and 658 arranged in the thin area 603.

Both ends of the heat generator 608 are connected to each of the terminals 624 and 629 illustrated in the lower half of FIG. 17. Here, as illustrated in FIG. 16, the current supplied from the transistor 606 to the heat generator 608 is applied to the terminal 624, and the terminal 629 is grounded.

The resistors 642, 644, 646, and 648 of the heating control bridge 640 are connected to each other and are connected to the terminals 626 and 630. As illustrated in FIG. 16, the terminal 626 is supplied with a predetermined voltage V3 from the power circuit 622, and the terminal 630 is grounded. In addition, the node between the resistors 642 and 646 and the node between the resistors 646 and 648 are connected to the terminals 627 and 628, respectively. As illustrated in FIG. 17, the terminal 627 outputs an electric potential of the node A between the resistors 642 and 646, and the terminal 627 outputs an electric potential of the node B between the resistors 644 and 648. As illustrated in FIG. 16, the terminal 625 is supplied with a predetermined voltage V2 from the power circuit 622, and the terminal 630 is grounded as a ground terminal. In addition, a node between the resistors 654 and 658 is connected to the terminal 631, and the terminal 631 outputs an electric potential of the node B of FIG. 16. The node between the resistors 652 and 656 is connected to the terminal 632, and the terminal 632 outputs an electric potential of the node C illustrated in FIG. 16.

As illustrated in FIG. 17, since the resistor 642 of the heating control bridge 640 is formed in the vicinity of the heat generator 608, it is possible to measure the temperature of the gas heated by the heat from the heat generator 608 with high accuracy. Meanwhile, since the resistors 644, 646, and 648 of the heating control bridge 640 are arranged distant from the heat generator 608, they are not easily influenced by the heat generated from the heat generator 608. The resistor 642 is configured to respond sensitively to the temperature of the gas heated by the heat generator 608, and the resistors 644, 646, and 648 are configured not to be influenced by the heat generator 608. For this reason, the detection accuracy of the measurement target gas 30 using the heating control bridge 640 is high, and the control for heating the measurement target gas by only a predetermined temperature from its initial temperature can be performed with high accuracy.

In this embodiment, a gap is formed in the rear surface side of the diaphragm 672 and communicates with the opening 438 illustrated in FIGS. 8(A) to 8(C) or FIGS. 5(A) to 5(D), so that a difference between the pressure of the gap in the rear side of the diaphragm 672 and the pressure in the front side of the diaphragm 672 does not increase. It is possible to suppress a distortion of the diaphragm 672 caused by this pressure difference. This contributes to improvement of the flow rate measurement accuracy.

As described above, the heat conduction through the diaphragm 672 is suppressed as small as possible by forming the thin area 603 and reducing the thickness of a portion including the thin area 603 in the diaphragm. Therefore, while influence of the heat conduction through the diaphragm 672 is suppressed, the bridge circuit of air flow sensing 650 or the heating control bridge 640 more strongly tends to operate depending on the temperature of the measurement target gas 30, so that the measurement operation is improved. For this reason, high measurement accuracy is obtained.

Hereinabove, although the embodiments of the present invention have been described in detail, the invention is not limited to the above embodiments, and various design changes may be made without departing from the spirit of the present invention described in the scope of the claims. For example, the above embodiments are described in detail for ease of describing the present invention but are not necessarily limited to the embodiments that encompass the entire configuration described above. In addition, the configuration of one embodiment can partially be replaced by the configuration of another embodiment, and the configuration of another embodiment can be added to the configuration of the one embodiment. Furthermore, the configuration of each embodiment can partially be removed, and the configuration of another embodiment can partially be added to or replaced with the configuration of each embodiment.

INDUSTRIAL AVAILABILITY

The present invention is applicable to a measurement apparatus for measuring a gas flow rate as described above.

REFERENCE SIGNS LIST 300 thermal flow meter
302 housing
303 front cover
304 rear cover
305 external connector
306 external terminal
307 calibration terminal
310 measuring portion
320 terminal connector
332 bypass passage trench on frontside
334 bypass passage trench on backside
356 protrusion
359 resin portion 361 inner socket of external terminal
371 covering portion
372 fixing portion
374 coupling portion (fixing means)
400 circuit package
412 connection terminal
414 terminal
424 protrusion
424a recessed groove (concave portion)
430 measurement surface
432 fixation surface
433 hatched area (covering surface)
436 heat transfer surface exposing portion
438 opening
452 temperature detecting portion
544 lead
544a cut end portion (first cut end portion)
545 lead
545a cut end portion (second cut end portion)
590 pressed fitting hole
594 slope portion
596 slope portion
601 air flow sensing circuit
602 air flow sensing portion
604 processing unit
608 heat generator
640 heating control bridge
650 bridge circuit of air flow sensing
672 diaphragm

The invention claimed is:

1. A thermal flow meter comprising:
a circuit package comprising a lead frame, a control circuit connected to a detection element electrically, and a mold resin sealing the control circuit; and
a housing to which the circuit package is fixed, wherein
the circuit package is sealed with a first mold resin through a first resin molding process, the housing is formed of a second mold resin through a second resin molding process,
a cut end portion of the lead exposed from the mold resin of the circuit package by cutting the support frame is covered by a covering portion, and
the covering portion is formed of the second mold resin in the second resin molding process.

2. The thermal flow meter according to claim 1, further comprising:
an external connector connecting electrically to external devices,
wherein the covering portion is formed by a resin forming the external connector.

3. The thermal flow meter according to claim 2, further comprising:
a fixed portion fixing the circuit package,
wherein the fixing portion is formed by a resin forming the external connector.

4. The thermal flow meter according to claim 2, wherein the mold resin sealing the control circuit is thermosetting resin and the resin forming the external connector is thermoplastic resin.

5. The thermal flow meter according to claim 3, wherein the mold resin sealing the control circuit is thermosetting resin and the resin forming the external connector is thermoplastic resin.

6. The thermal flow meter according to claim 1, wherein the lead frame has a plural of cut end portions of the lead frame covered with the covering portion and a voltage difference between the plural of cut end portions are caused.

7. A method of manufacturing the thermal flow meter according to claim 1, comprising:
supporting leads by a support frame and sealing the control circuit mounted on the lead frame by the mold resin,
cutting off the leads so as to separate the circuit package from the support frame,
covering the cut end portion of the leads exposed from the mold resin sealing the control circuit of the circuit package.

* * * * *